US012004351B2

(12) United States Patent
Hossain et al.

(10) Patent No.: US 12,004,351 B2
(45) Date of Patent: *Jun. 4, 2024

(54) INTEGRATED ASSEMBLIES, AND METHODS OF FORMING INTEGRATED ASSEMBLIES

(71) Applicant: Lodestar Licensing Group LLC, Evanston, IL (US)

(72) Inventors: S. M. Istiaque Hossain, Boise, ID (US); Prakash Rau Mokhna Rau, Boise, ID (US); Arun Kumar Dhayalan, Boise, ID (US); Damir Fazil, Boise, ID (US); Joel D. Peterson, Boise, ID (US); Anilkumar Chandolu, Boise, ID (US); Albert Fayrushin, Boise, ID (US); George Matamis, Eagle, ID (US); Christopher Larsen, Boise, ID (US); Rokibul Islam, Meridian, ID (US)

( * ) Notice: Subject to any disclaimer, the term of this patent is extended or adjusted under 35 U.S.C. 154(b) by 63 days.

This patent is subject to a terminal disclaimer.

(21) Appl. No.: 17/869,732

(22) Filed: Jul. 20, 2022

(65) Prior Publication Data

US 2022/0367512 A1 Nov. 17, 2022

Related U.S. Application Data

(63) Continuation of application No. 16/984,457, filed on Aug. 4, 2020, now Pat. No. 11,430,809.

(51) Int. Cl.
*H10B 43/27* (2023.01)
*G11C 5/02* (2006.01)
(Continued)

(52) U.S. Cl.
CPC ............. *H10B 43/27* (2023.02); *G11C 5/025* (2013.01); *G11C 5/06* (2013.01); *G11C 16/0466* (2013.01);
(Continued)

(58) Field of Classification Search
CPC ......... H01L 27/11582; H01L 21/76802; H01L 21/76877; G11C 5/025; G11C 5/06; G11C 16/0466
See application file for complete search history.

(56) References Cited

U.S. PATENT DOCUMENTS 9,230,987 B2 * 1/2016 Pachamuthu .......... H10B 63/84
2015/0155296 A1 6/2015 Yoon
(Continued)

FOREIGN PATENT DOCUMENTS

WO WO 10/2021
PCT/US2021/040871
WO WO 2/2023
PCT/US2021/040871

*Primary Examiner* — Karen Kusumakar
(74) *Attorney, Agent, or Firm* — Brooks, Cameron & Huebsch, PLLC

(57) ABSTRACT

Some embodiments include an integrated assembly having a first deck. The first deck has first memory cell levels alternating with first insulative levels. A second deck is over the first deck. The second deck has second memory cell levels alternating with second insulative levels. A cell-material-pillar passes through the first and second decks. Memory cells are along the first and second memory cell levels and include regions of the cell-material-pillar. An intermediate level is between the first and second decks. The intermediate level includes a buffer region adjacent the cell-material-pillar. The buffer region includes a composition different from the first and second insulative materials, and different from the first and second conductive regions. Some embodiments include methods of forming integrated assemblies.

17 Claims, 24 Drawing Sheets

(51) Int. Cl.
  *G11C 5/06* (2006.01)
  *G11C 16/04* (2006.01)
  *H01L 21/768* (2006.01)

(52) U.S. Cl.
  CPC .. *H01L 21/76802* (2013.01); *H01L 21/76877* (2013.01)

(56) References Cited

U.S. PATENT DOCUMENTS

| | | |
|---|---|---|
| 2017/0263614 A1 | 9/2017 | Tokuhira et al. |
| 2017/0271352 A1 | 9/2017 | Nakamura |
| 2019/0139975 A1 | 5/2019 | Oh |
| 2019/0288002 A1 | 9/2019 | Lu et al. |
| 2020/0091186 A1 | 3/2020 | Yang et al. |
| 2020/0194457 A1 | 6/2020 | Lee et al. |

\* cited by examiner

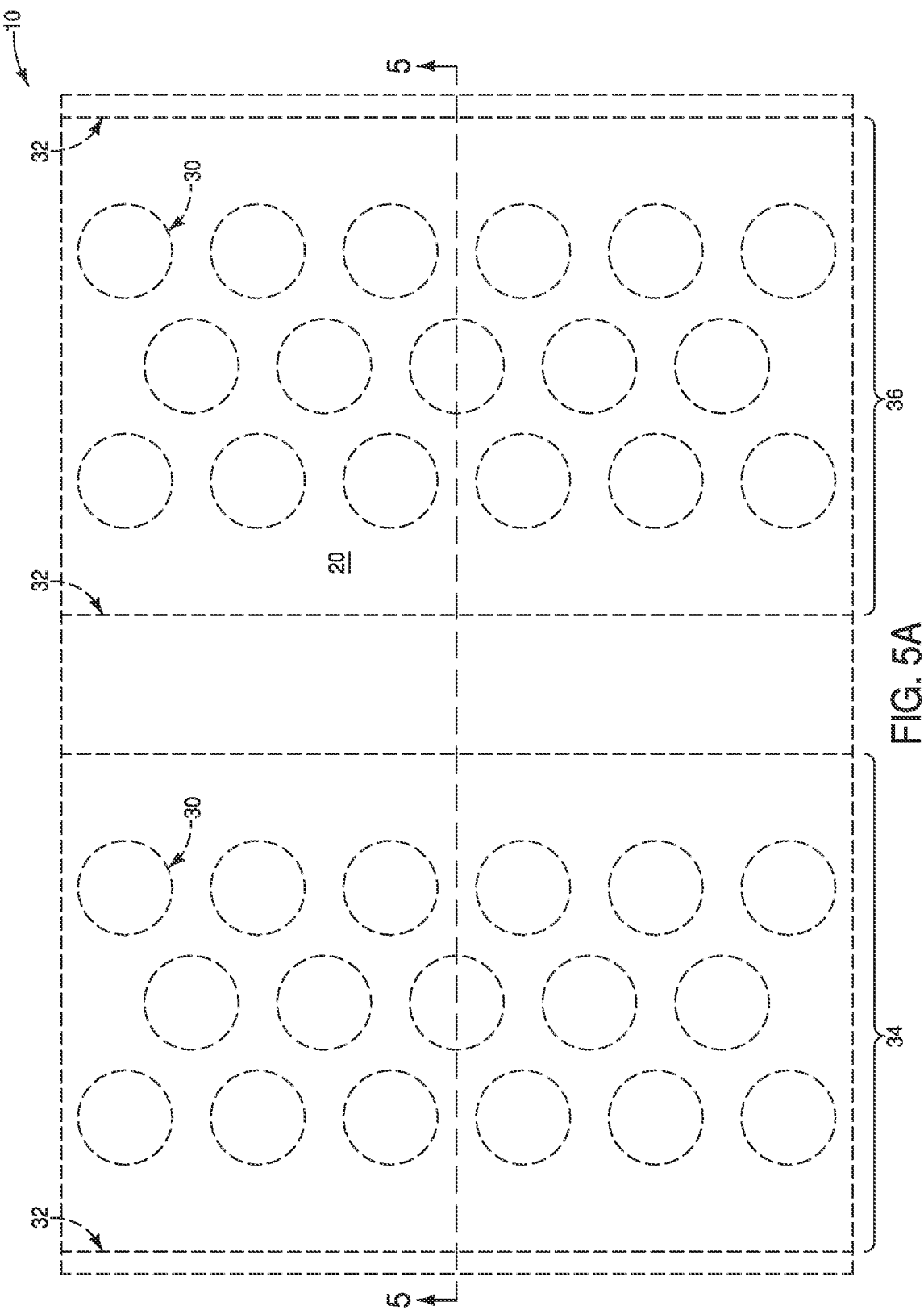

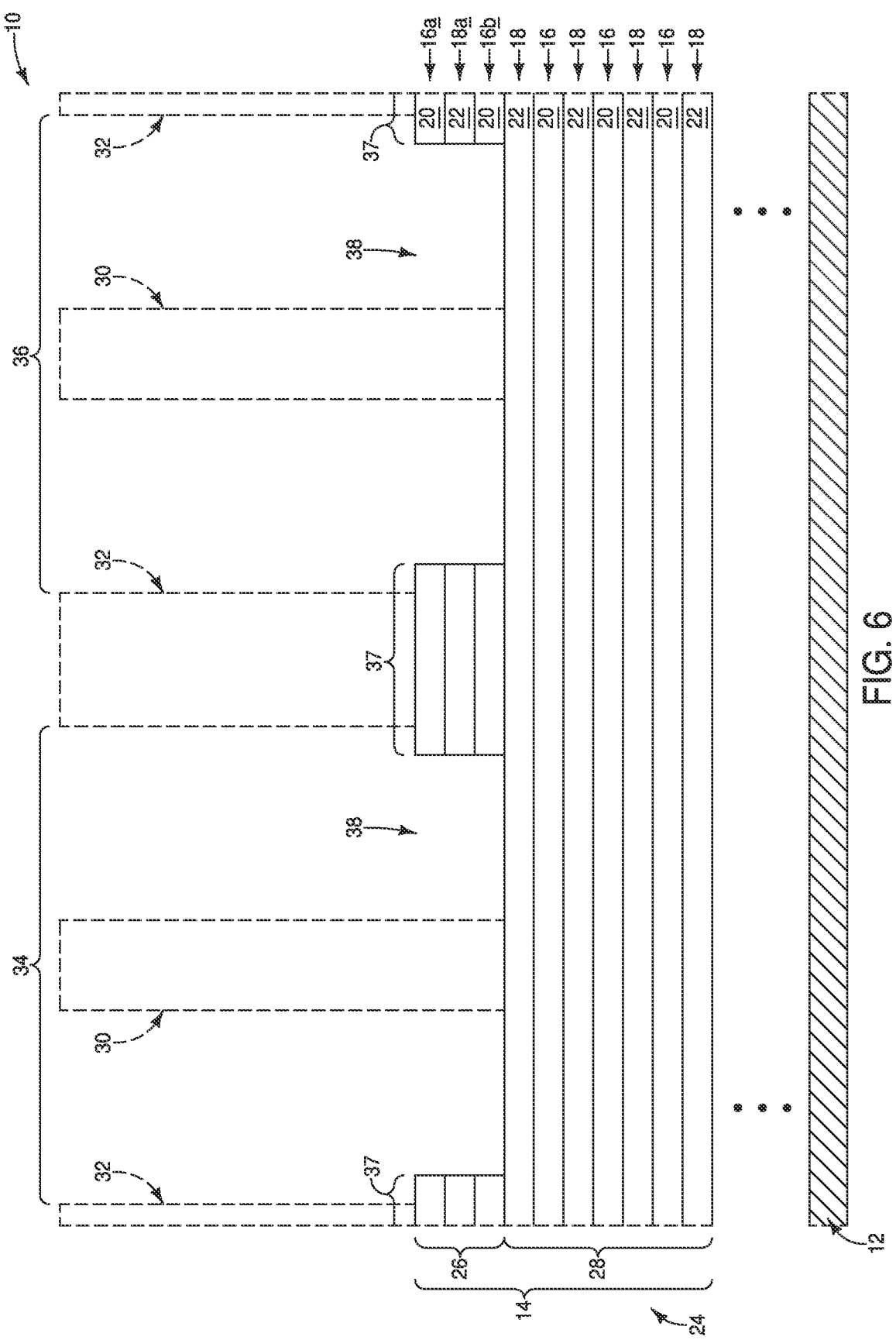

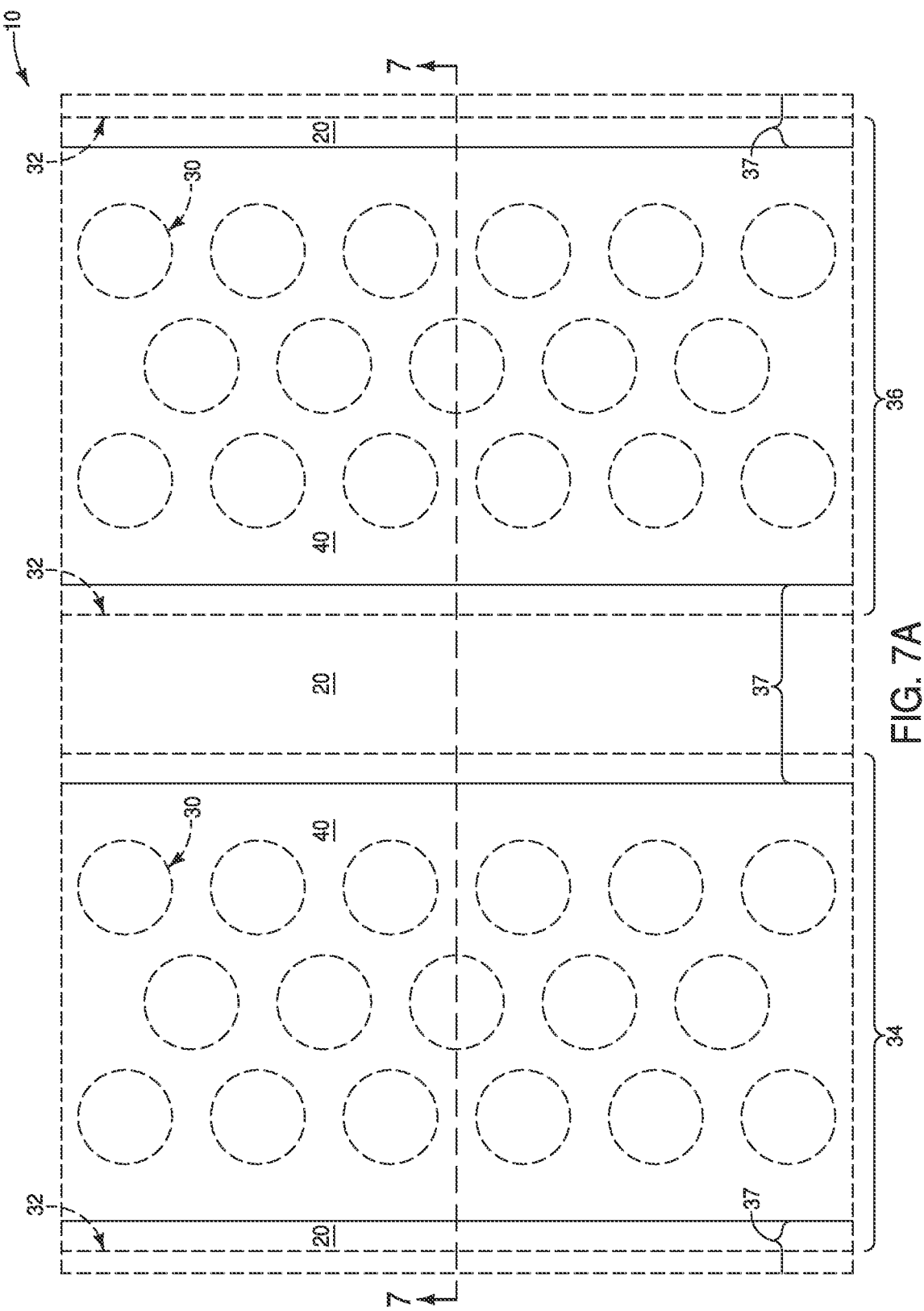

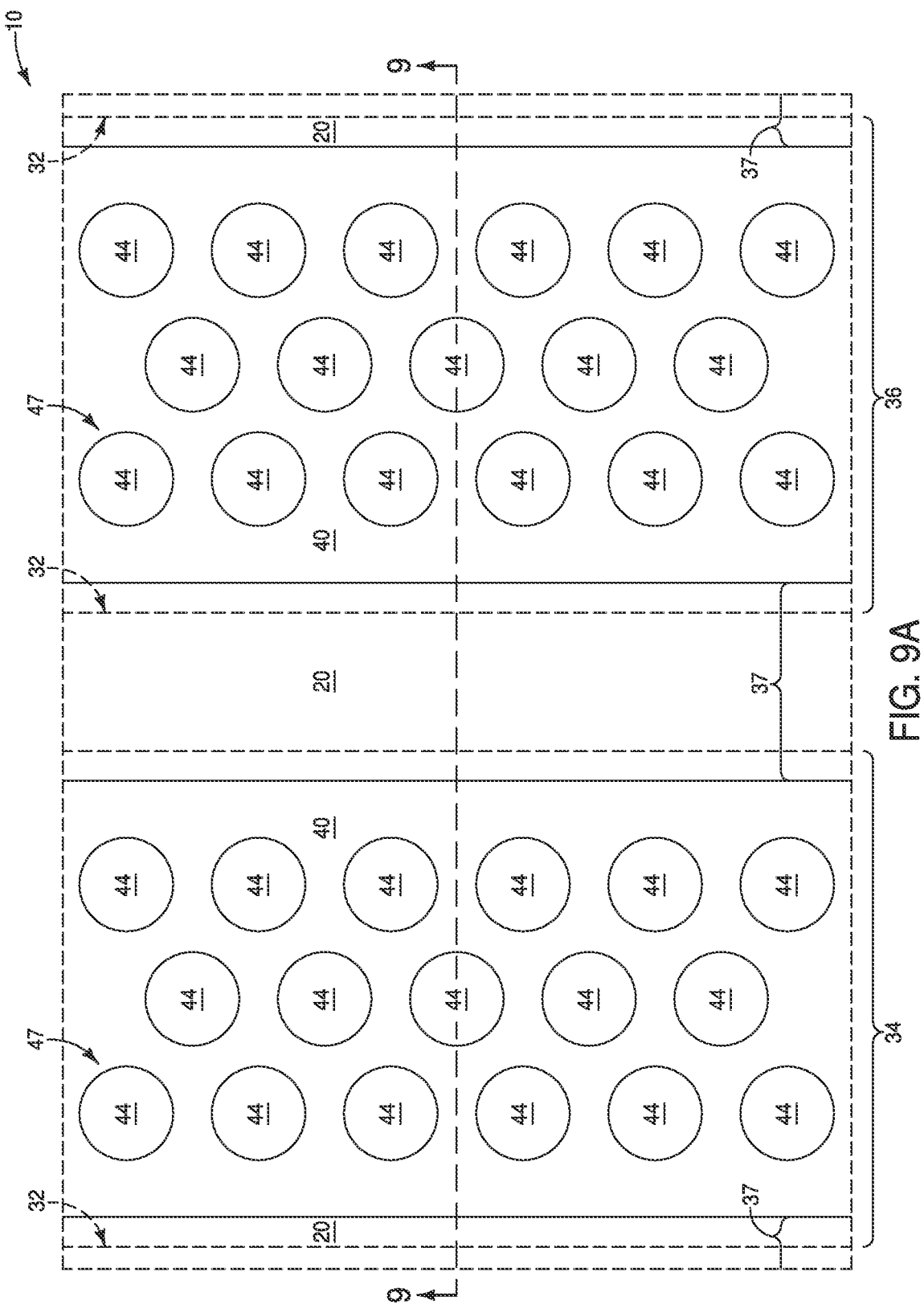

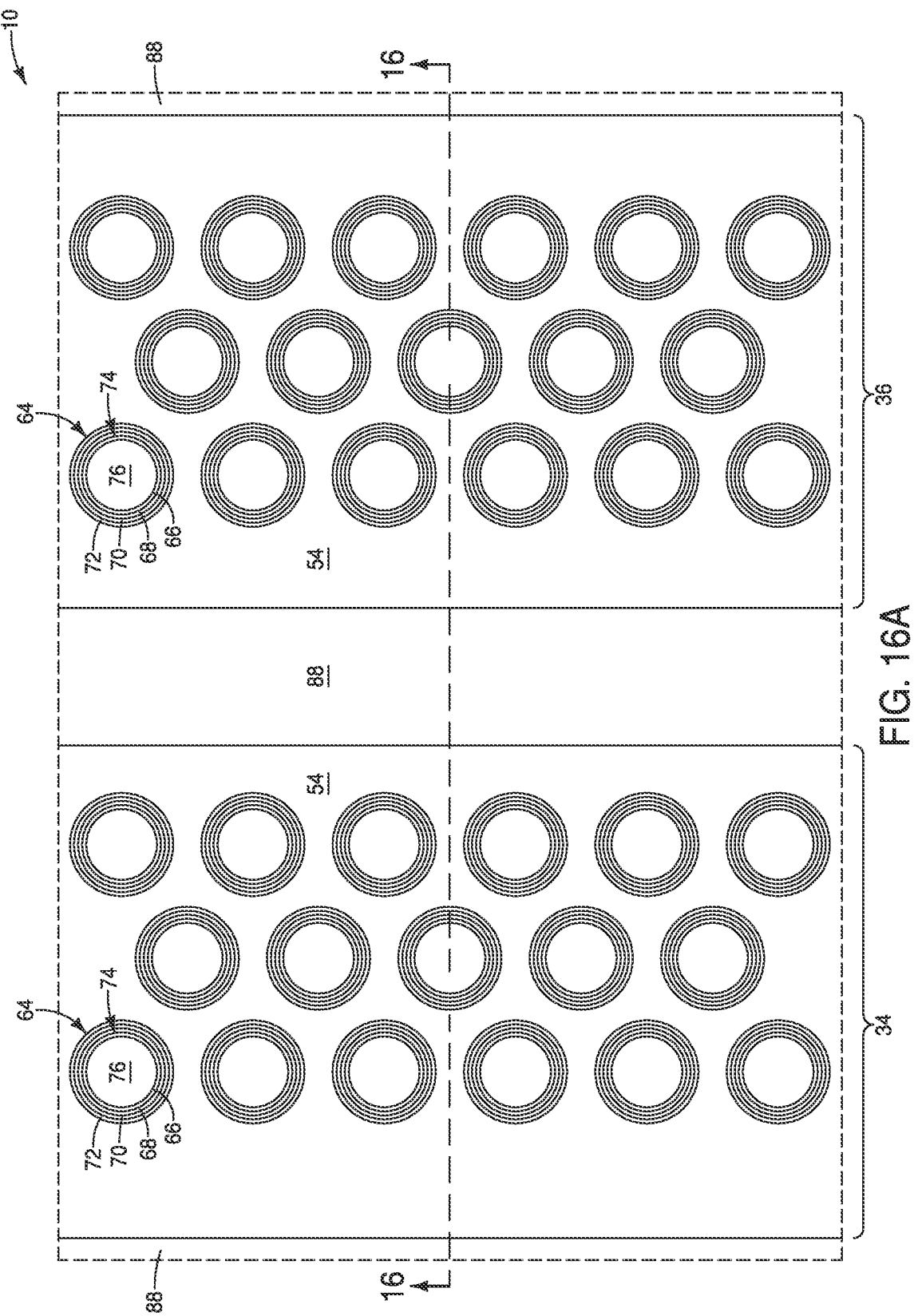

INTEGRATED ASSEMBLIES, AND METHODS OF FORMING INTEGRATED ASSEMBLIES

RELATED PATENT DATA

This patent resulted from a continuation application of U.S. patent application Ser. No. 16/984,457, filed Aug. 4, 2020, the disclosures of which are incorporated herein by reference.

TECHNICAL FIELD

Methods of forming integrated assemblies (e.g., integrated memory devices). Integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved methods of forming integrated memory (e.g., NAND memory). It is also desired to develop improved memory devices.

BRIEF DESCRIPTION OF THE DRAWINGS

FIGS. 5 and 5A are a diagrammatic cross-sectional side view (FIG. 5) and a diagrammatic top-down view (FIG. 5A) of an example integrated assembly at an example process stage of an example embodiment method for forming an example memory device. The cross-sectional side view of FIG. 5 is along the line 5-5 of FIG. 5A.

FIG. 6 is a diagrammatic cross-sectional side view of the example integrated assembly of FIG. 5 at an example process stage following that of FIG. 5.

FIGS. 7 and 7A are a diagrammatic cross-sectional side view (FIG. 7) and a diagrammatic top-down view (FIG. 7A) of the example integrated assembly of FIG. 5 at an example process stage following that of FIG. 6. The cross-sectional side view of FIG. 7 is along the line 7-7 of FIG. 7A.

FIGS. 9 and 9A are a diagrammatic cross-sectional side view (FIG. 9) and a diagrammatic top-down view (FIG. 9A) of the example integrated assembly of FIG. 5 at an example process stage following that of FIG. 8. The cross-sectional side view of FIG. 9 is along the line 9-9 of FIG. 9A.

FIGS. 16 and 16A are a diagrammatic cross-sectional side view (FIG. 16) and a diagrammatic top-down view (FIG. 16A) of the example integrated assembly of FIG. 5 at an example process stage following that of FIG. 15. The cross-sectional side view of FIG. 16 is along the line 16-16 of FIG. 16A.

DETAILED DESCRIPTION OF THE ILLUSTRATED EMBODIMENTS

Some embodiments include methods of forming memory with two or more decks stacked one atop another, and some embodiments include configurations having two or more decks stacked one atop another. Example embodiments are described with reference to FIGS. 5-20.

Figure 1:
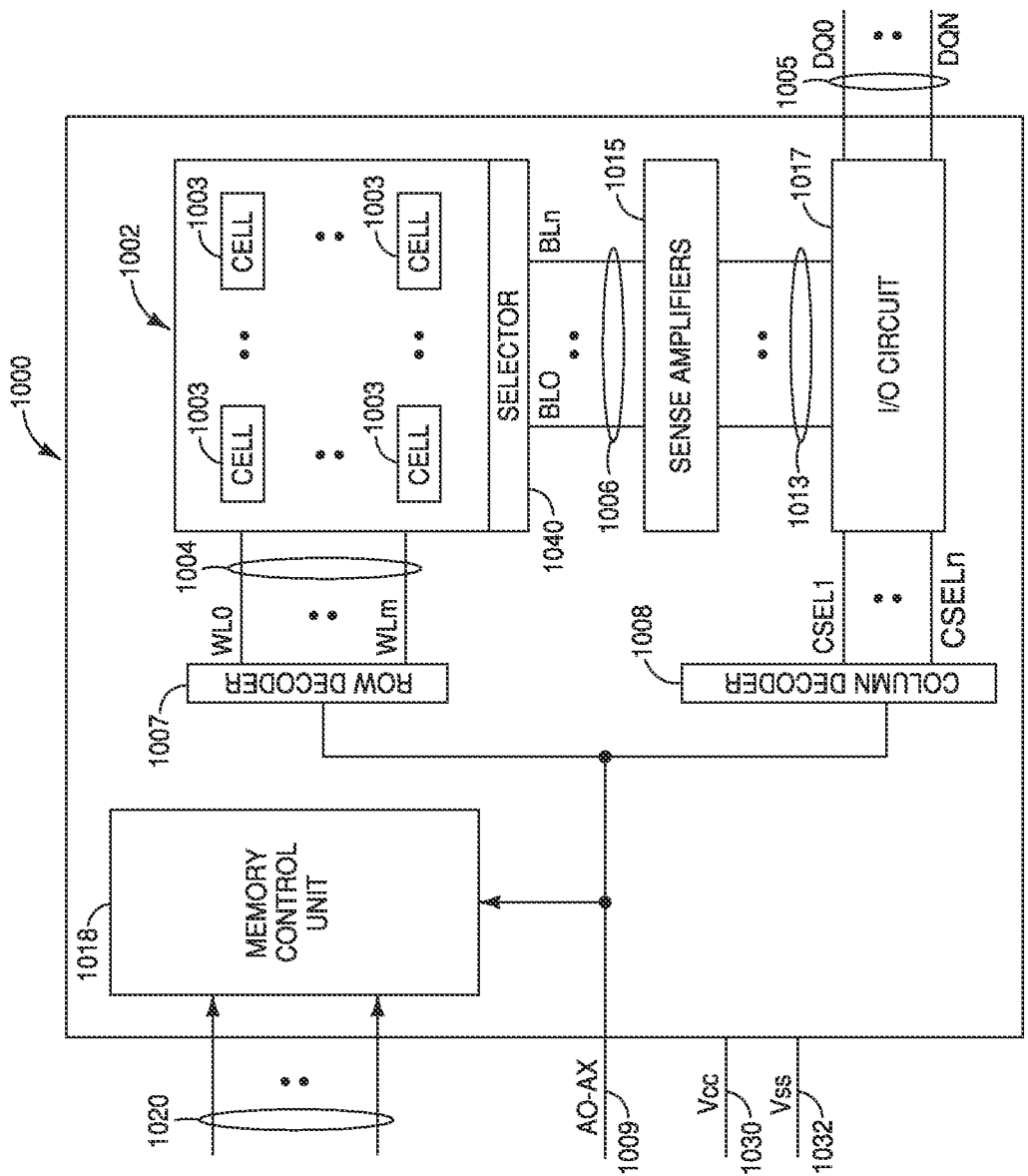
FIG. 1 shows a block diagram of a prior art memory device having a memory array with memory cells.
Figure 2:
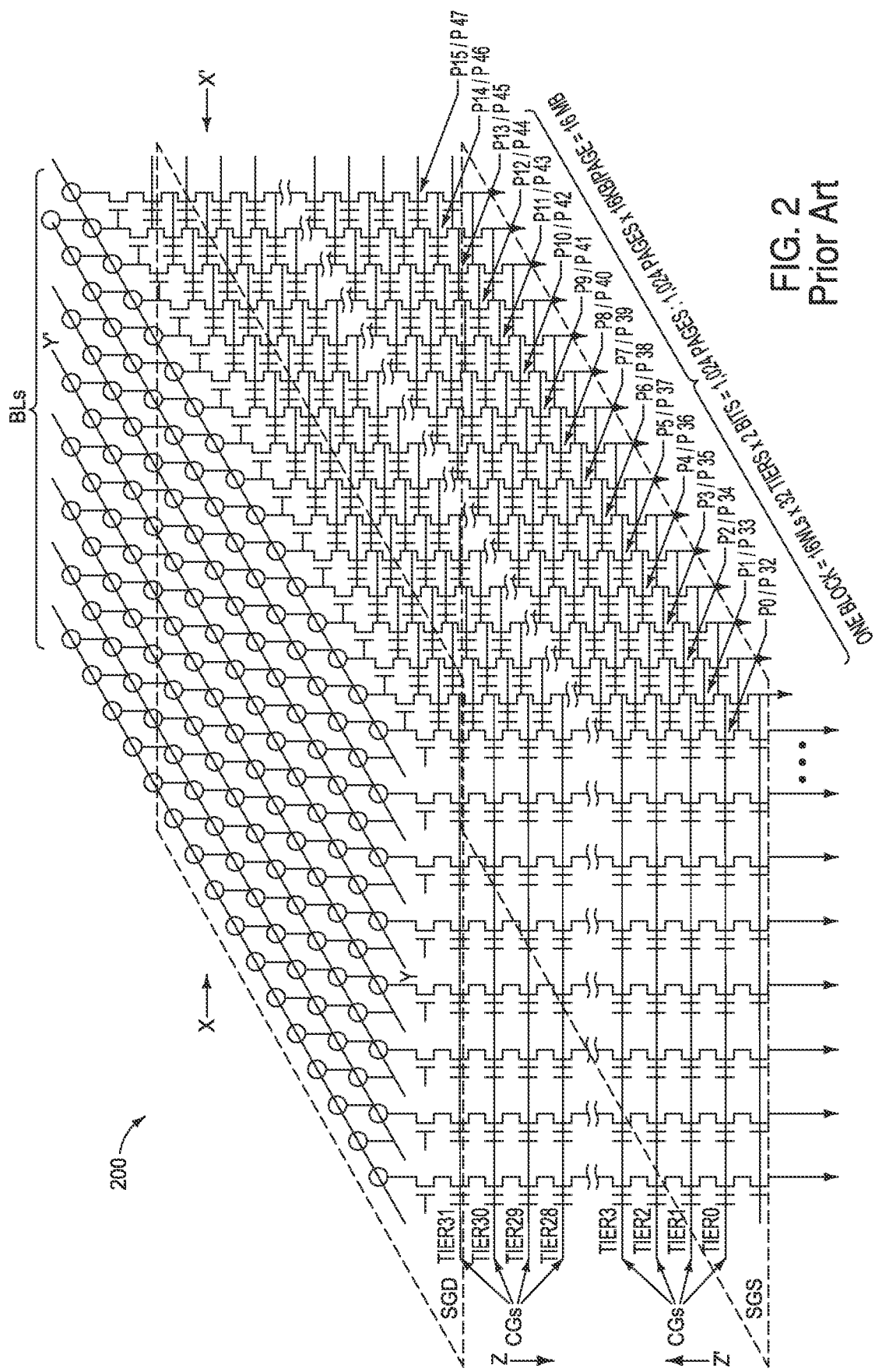
FIG. 2 shows a schematic diagram of the prior art memory device of FIG. 1 in the form of a 3D NAND memory device.
Figure 3:
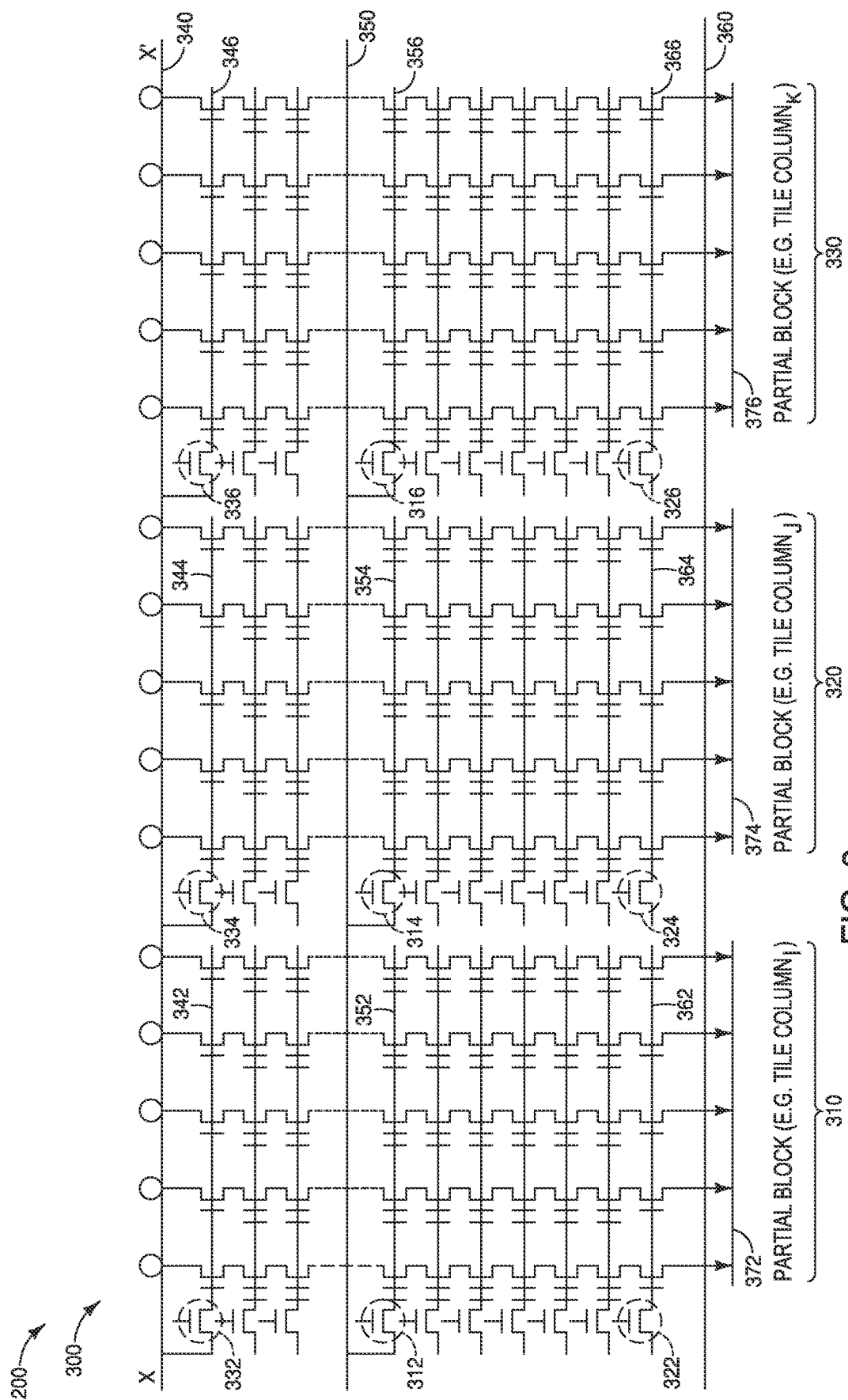
FIG. 3 shows a cross-sectional view of the prior art 3D NAND memory device of FIG. 2 in an X-X' direction.
Figure 4:
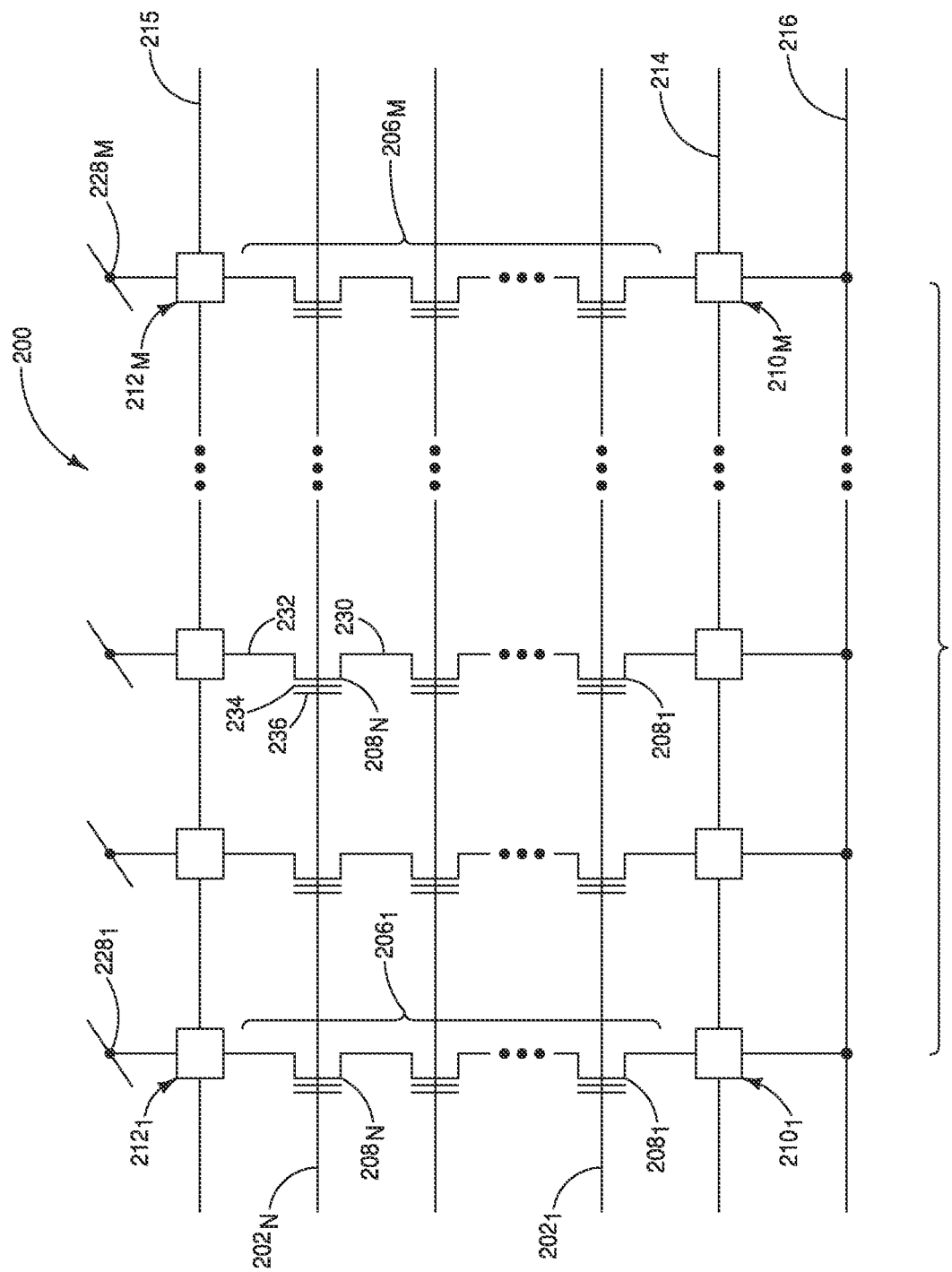
FIG. 4 is a schematic diagram of a prior art NAND memory array.
Figure 5:
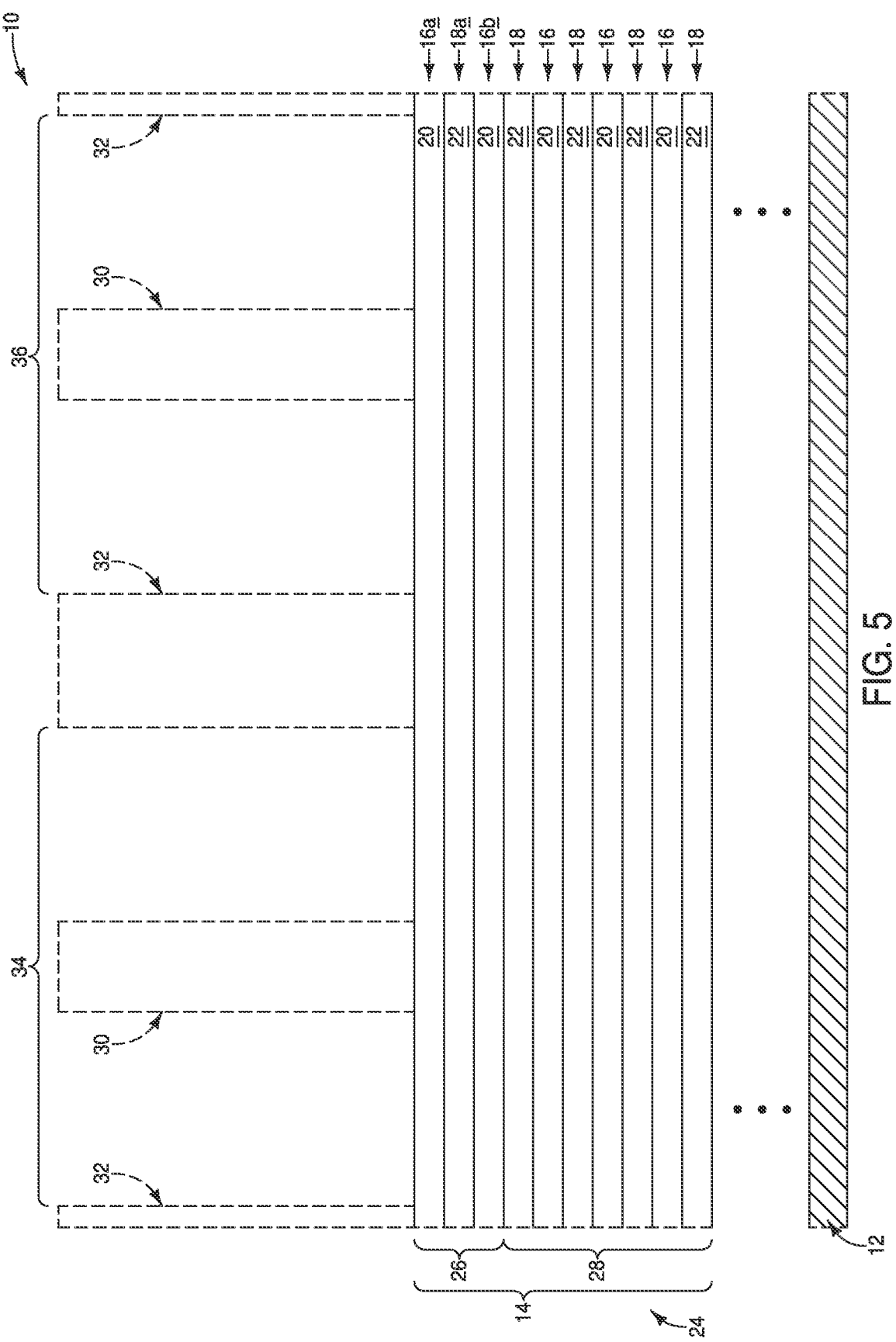

Referring to FIG. 5, an integrated assembly 10 includes a conductive structure 12. The conductive structure 12 may be a source structure analogous to the source structures described above in the Background section. The conductive structure 12 may comprise any suitable electrically conductive composition(s), and in some embodiments may comprise conductively-doped semiconductor material (e.g., n-type silicon) over metal-containing material (e.g., one or both of tungsten and tungsten silicide).

The source structure 12 may be supported by a semiconductor substrate (base). The semiconductor substrate is not shown in the figures of this disclosure to simplify the drawings. The semiconductor substrate may comprise any suitable semiconductor composition(s); and in some embodiments may comprise monocrystalline silicon.

A stack 14 of alternating first and second tiers (levels, layers) 16 and 18 is formed over the conductive structure 12. The stack 14 may comprise any suitable number of alternating tiers 16 and 18. The first tiers 16 ultimately become conductive levels of a memory arrangement. There may be any suitable number of tiers 16 to form the desired number of conductive levels. In some embodiments, the number of tiers 16 may be 8, 16, 32, 64, etc.

The first tiers 16 comprise a first material 20. Such first material may comprise any suitable composition(s), and in some embodiments may comprise, consist essentially of, or consist of silicon nitride.

The second tiers 18 comprise a second material 22. Such material may be an insulative material, and may comprise any suitable composition(s). In some embodiments, the second material 22 may comprise, consist essentially of, or consist of silicon dioxide.

In some embodiments, the materials 20 and 22 may be referred to as a first material and an insulative second material, respectively.

The tiers 16 and 18 may be of any suitable thicknesses; and may be the same thickness as one another, or may be different thicknesses relative to one another. In some embodiments, the tiers 16 and 18 may have vertical thicknesses within a range of from about 10 nanometers (nm) to about 400 nm.

The stack 14 is spaced from the conductive structure 12 by a gap. Such gap is utilized to indicate that there may be one or more additional components, structures, etc., between the illustrated region of the stack 14 and the conductive structure 12. Such additional structures may include, for example, source-side select gate (SGS) structures. The SGS structures (not shown) may be formed at a process stage subsequent to that of FIGS. 5 and 5A.

One of the first tiers 16 is an uppermost of the first tiers, and is labeled as 16a to distinguish it from the other first tiers. One of the first tiers is a penultimate first tier, and is labeled as 16b to distinguish it from the other first tiers.

One of the second tiers is an uppermost of the second tiers, and is labeled as 18a to distinguish it from the other second tiers. The uppermost second tier 18a is between the penultimate first tier 16b and the uppermost first tier 16a.

The stack 14 may be referred to as a first stack. A first deck 24 may be considered to include at least a portion of the first stack 14. In some embodiments, the first deck 24 may include the entirety of the first stack 14. In some embodiments, the levels 16a, 16b and 18a may be considered to correspond to an intermediate region 26. A lower portion 28 of the first stack 14 may be considered to correspond to the portion beneath the intermediate region 26.

The illustrated intermediate region 26 includes two of the first tiers 16 and one of the second tiers 18. Generally, the intermediate region may include one or more of the first tiers and one or more than one of the second tiers.

Channel-material-pillars will eventually extend through the stack 14, and slits will be provided between the channel-material-pillars to divide the pillars amongst memory blocks. Example locations for the channel-material-pillars are diagrammatically illustrated at the regions (areas) 30, and example locations for the slits are diagrammatically illustrated at the regions (areas) 32.

FIG. 5A shows a top view of the assembly 10 of FIG. 5, and shows an example arrangement for the channel-material-pillar-locations 30 and the slit-locations 32. The slit-locations 32 may be considered to define edges of memory-block-regions 34 and 36, and the channel-material-pillar-locations 30 may be considered to be within such memory-block regions. In some embodiments, some portions of the stack 14 may be considered to be within the memory-block-regions 34 and 36, and some portions may be considered to be within the slit-regions between the memory-block-regions.

Referring to FIG. 6, trenches 38 are formed to extend into the intermediate regions 26 (and in the shown embodiment are shown to be formed to extend through the tiers 16a, 16b and 18a). The trenches 38 extend substantially entirely across the memory-block-regions 34 and 36.

The illustrated embodiment of FIG. 6 has the trenches 38 extending through two of the first tiers 16. Generally, the trenches 38 will extend through one or more of the first tiers, and will land on (or will extend into) one of the second tiers 18 (i.e., bottom peripheries of trenches will comprise the material 22 of the second tiers 18).

The formation of the trenches 38 removes some of the intermediate region 36 to leave remaining regions (portions) 37 of the intermediate region 36 between the trenches 38. The remaining regions 37 may be considered to include portions of the layers 16a, 16b and 18a.

Figure 7:
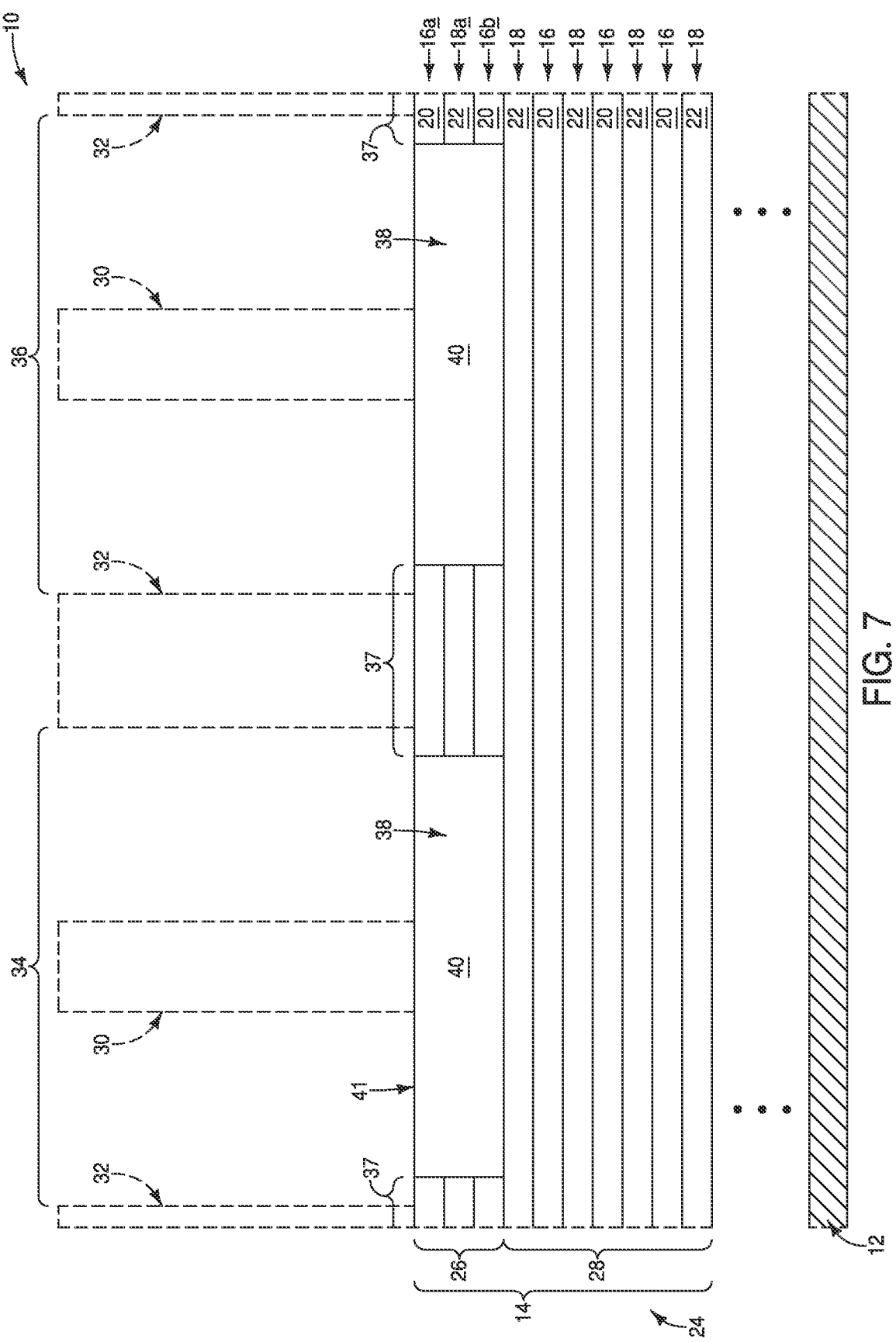

Referring to FIG. 7, buffer material 40 is formed within the trenches 38. In some embodiments, the buffer material 40 may be formed to fill (or overfill) the trenches 38, and then planarization (e.g., chemical-mechanical polishing, CMP) may be utilized to remove any excess material 40 and form the illustrated planarized surface 41 extending across the remaining regions 37 of the uppermost first tiers 16a and the buffer material 40.

The buffer material 40 may comprise any suitable composition(s). The buffer material may be a semiconductive composition (e.g., may comprise silicon, germanium, etc.), an insulative composition (e.g., may comprise hafnium oxide, zirconium oxide, etc.), or a conductive composition (e.g., may comprise tungsten, titanium, tungsten silicide, etc.).

In some embodiments, the buffer material 40 may comprise, consist essentially of, or consist of one or more of silicon, carbon-doped silicon nitride, aluminum-doped magnesium oxide, hafnium oxide, zirconium oxide and manganese oxide. The carbon-doped silicon nitride may comprise a carbon concentration within a range of from about 5 atomic percent (at %) to about 15 at %, and in some embodiments may comprise a carbon concentration within a range of from about 8 at % to about 9 at %. The aluminum-doped magnesium oxide may comprise an aluminum concentration greater than 0 at %, and in some embodiments may comprise an aluminum concentration within a range of from greater than 0 at % to about 15 at %.

In some embodiments, the buffer material 40 may comprise, consist essentially of, or consist of metal. For instance, the buffer material 40 may comprise, consist essentially of, or consist of one or both of titanium and tungsten.

In some embodiments, the buffer material 40 may comprise, consist essentially of, or consist of one or more of metal oxide, metal carbide, metal boride, metal nitride and metal silicide. For instance, the buffer material 40 may comprise, consist essentially of, or consist of one or more of tungsten nitride, titanium nitride, tungsten silicide and titanium silicide.

FIG. 7A shows a top view of the assembly 10 of FIG. 7, and shows that the buffer material 40 extends substantially entirely across the memory-block-regions (memory-block-locations) 34 and 36. In some embodiments, the memory-block-regions 34 and 36 may be considered to correspond to memory blocks of the types described above with reference to FIGS. 1-4.

Figure 8:
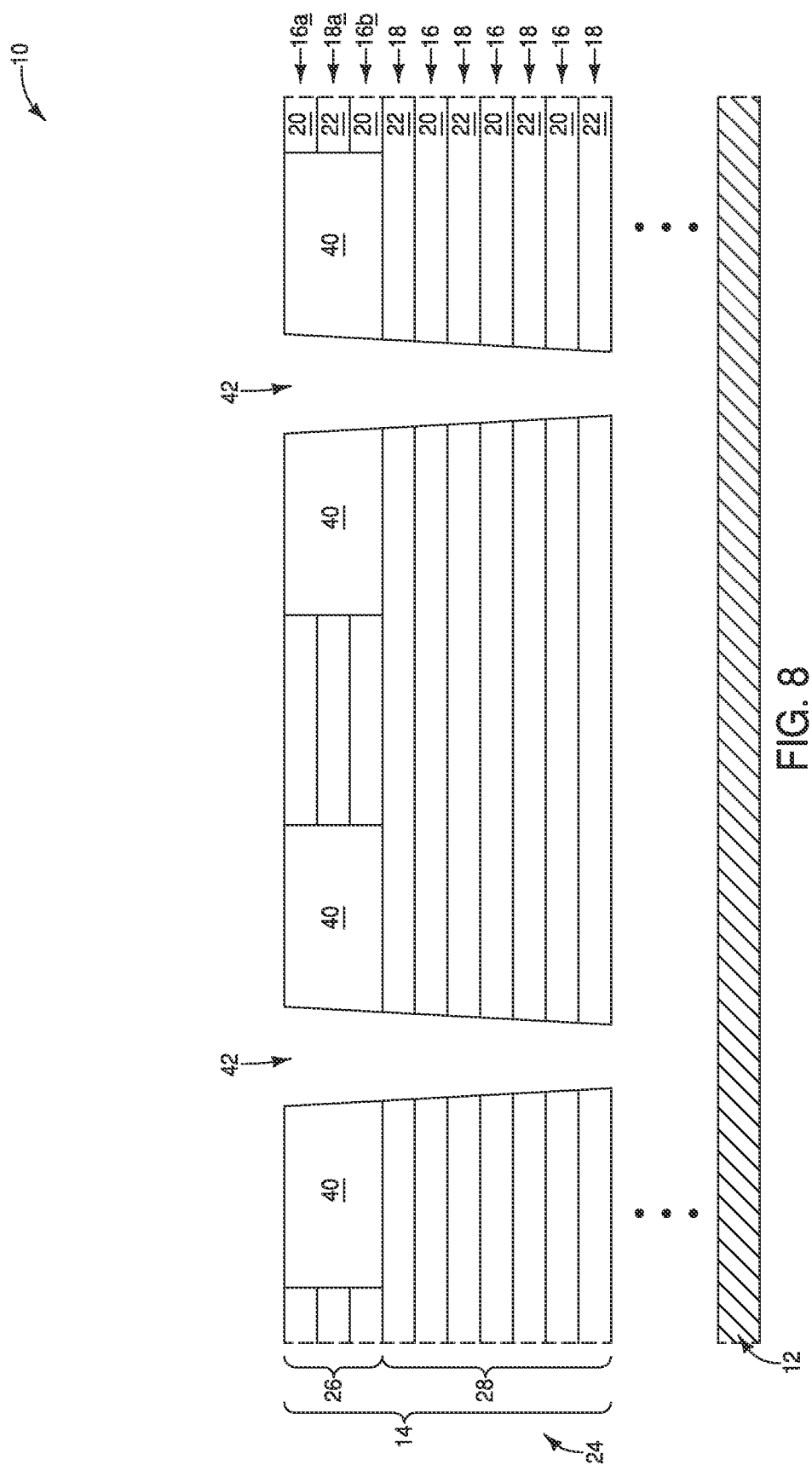
FIG. 8 is a diagrammatic cross-sectional side view of the example integrated assembly of FIG. 5 at an example process stage following that of FIG. 7.

Referring to FIG. 8, openings 42 are formed to extend through the buffer material 40, and through the lower portion 28 of the stack 14. The openings 42 may be formed with any suitable processing. For instance, a masking material (not shown) may be provided to define locations of the openings 42, the openings 42 may be formed to extend through the materials 20, 22 and 40 with one or more suitable etches, and then the masking material may be removed to leave the illustrated configuration of FIG. 8. In some embodiments, the openings 42 may be referred to as first openings to distinguish them from other openings formed at subsequent process stages. The openings 42 are formed at the regions 30 (FIG. 7).

Figure 9:
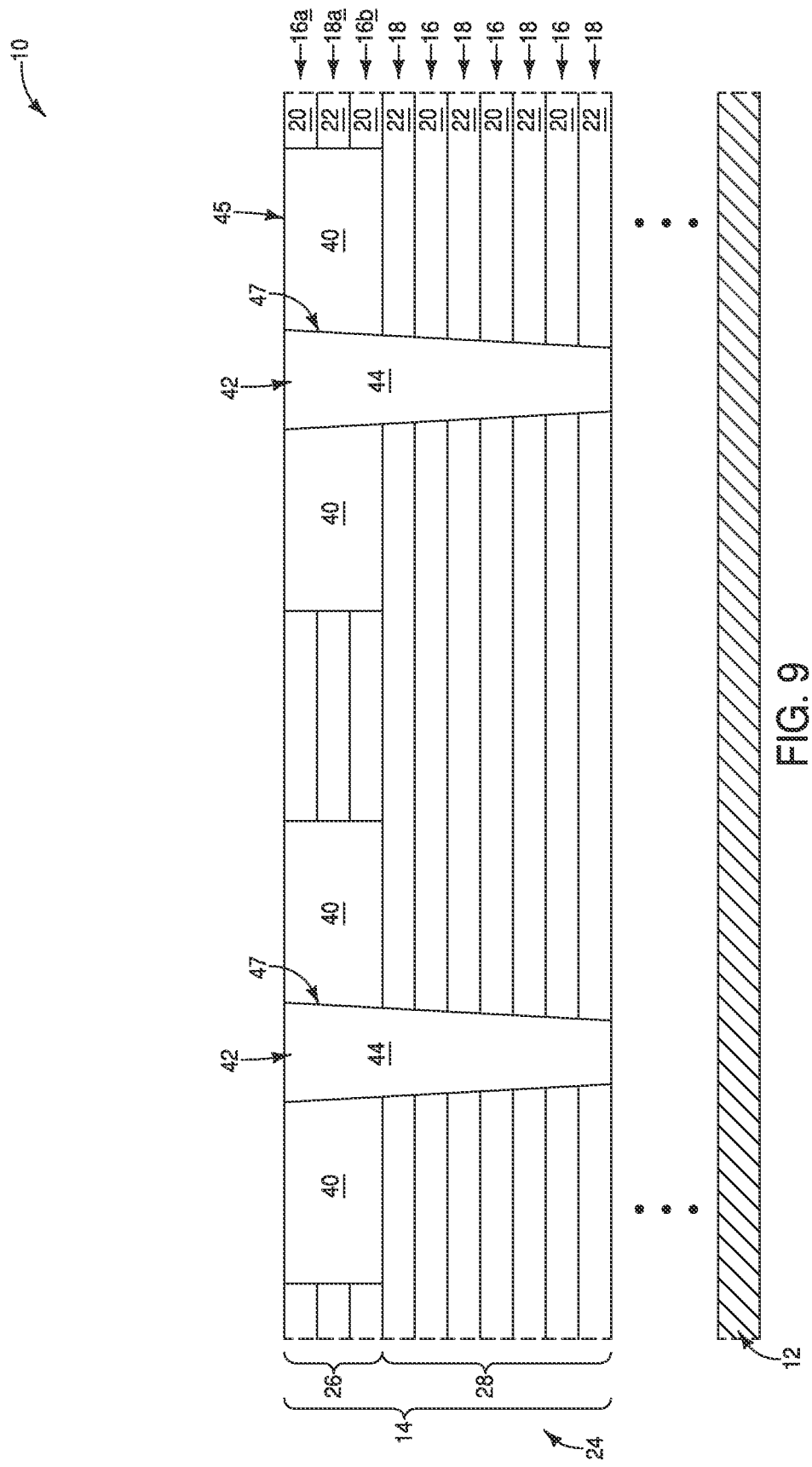

Referring to FIG. 9, sacrificial material 44 is formed within the openings 42. The sacrificial material 44 may comprise any suitable composition(s) which may be selectively removed relative to the materials 20, 22 and 40. For instance, in some embodiments the sacrificial material 44 may comprise a substance selected from group consisting of carbon, silicon, metal (e.g., tungsten), etc.

A planarized surface 45 is formed to extend across the sacrificial material 44, the buffer material 40, and the uppermost tier 16a. The planarized surface 45 may be formed with any suitable processing, such as, for example, CMP. The sacrificial material 44 may be considered to be configured as plugs 47 which extend through the stack 14.

FIG. 9A shows a top-down view of the configuration of FIG. 9, and shows the plugs 47 arranged in tightly-packed configurations across the memory-block-regions 34 and 36.

Figure 10:
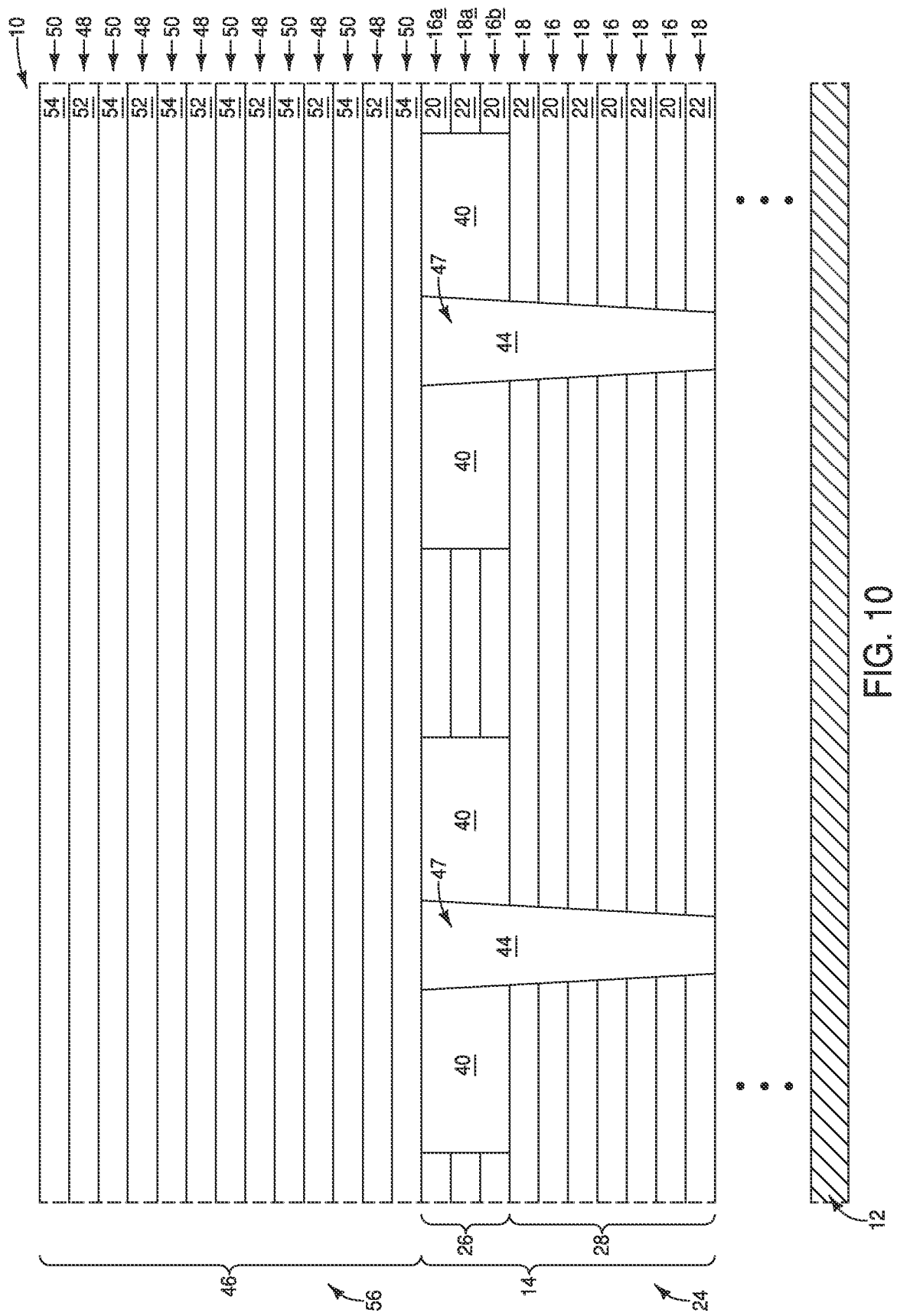
FIGS. 10-15 are diagrammatic cross-sectional side views of the example integrated assembly of FIG. 5 at example sequential process stages following that of FIG. 9.

Referring to FIG. 10, a second stack 46 of alternating third and fourth tiers (levels, layers) 48 and 50 is formed over the first stack 14. The stack 46 may comprise any suitable number of alternating tiers 48 and 50. The third tiers 48 ultimately become conductive levels of a memory arrangement. There may be any suitable number of tiers 48 to form the desired number of conductive levels. In some embodiments, the number of tiers 48 may be 8, 16, 32, 64, etc.

The third tiers 48 comprise a third material 52. Such third material may comprise any suitable composition(s), and in some embodiments may comprise, consist essentially of, or consist of silicon nitride. Accordingly, the third material 52 may comprise a same composition as the first material 20.

The fourth tiers 50 comprise a fourth material 54. Such material may be an insulative material, and may comprise any suitable composition(s). In some embodiments, the fourth material 54 may comprise, consist essentially of, or consist of silicon dioxide. In some embodiments, the insulative fourth material 54 may comprise a same composition as the insulative second material 22.

The tiers 48 and 50 may have the same thicknesses described above relative to the tiers 16 and 18.

The second stack 46 may be considered to be comprised by a second deck 56.

Figure 11:
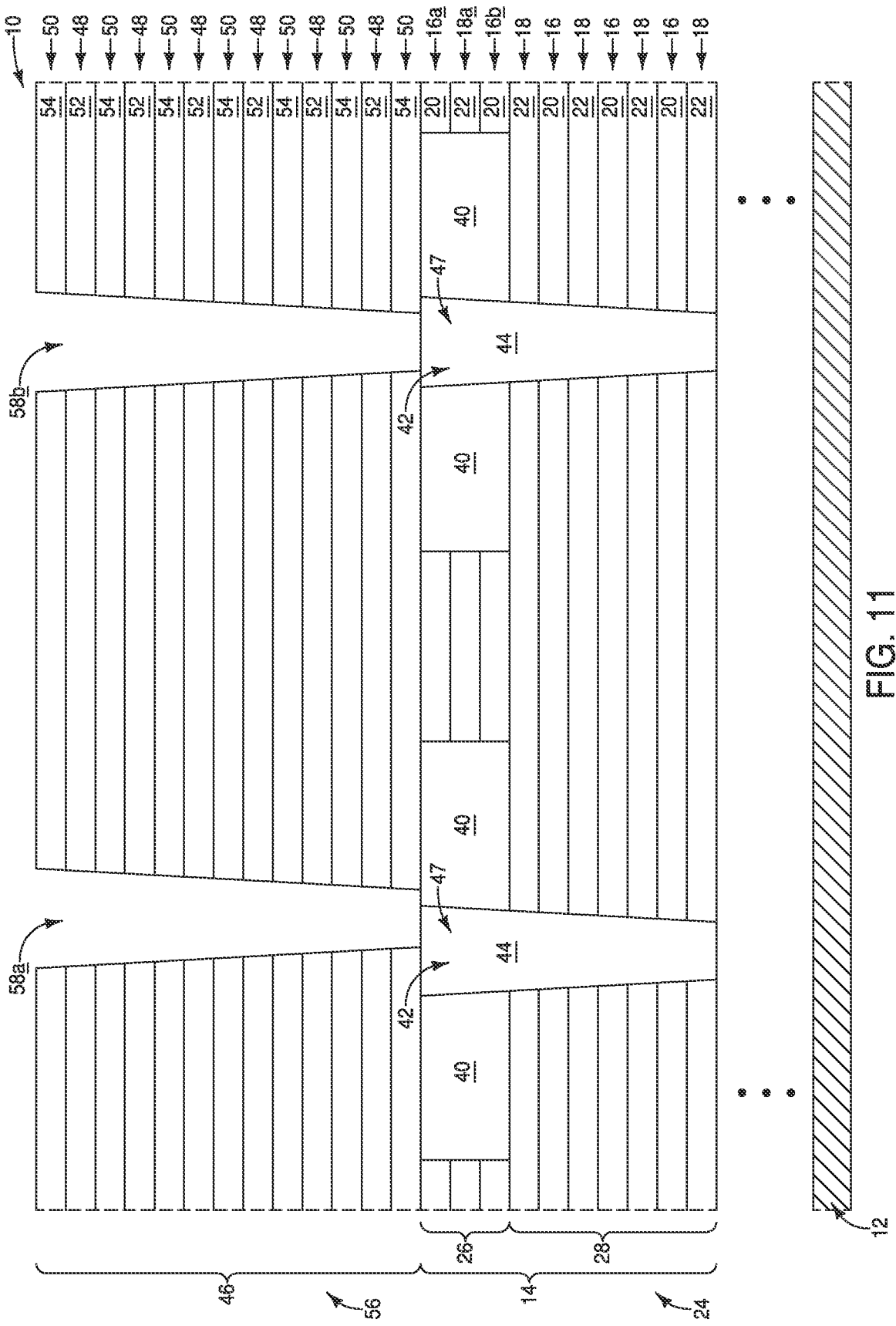

Referring to FIG. 11, second openings 58 are formed to extend through the second stack 46. The second openings 58 extend to the sacrificial material 44.

One of the second openings 58 is labeled 58a, and is misaligned relative to the underlying first opening 42 in the illustrated embodiment of FIG. 11. The other of the second openings 58 is labeled 58b, and is aligned relative to the underlying opening 42.

The buffer material 40 forms a hard stop (i.e., an etch stop) so that the misaligned region of the opening 58a does not penetrate through the intermediate region 26 into underlying materials of the first stack 14. Such may avoid problems associated with conventional processes (i.e., processes lacking the material 40 of the region 26). The problems may include shaving of materials 20 and 22 within an upper region of the second stack 14 due to the misaligned portions of opening 58a leading to removal of regions of such materials. The shaving may adversely impact the configuration of structures which are subsequently formed within openings 58/42, which may lead to impaired device performance, or even to inoperable devices. Accordingly, the processing described herein may advantageously alleviate or prevent problems associated with conventional fabrication processes.

Figure 12:
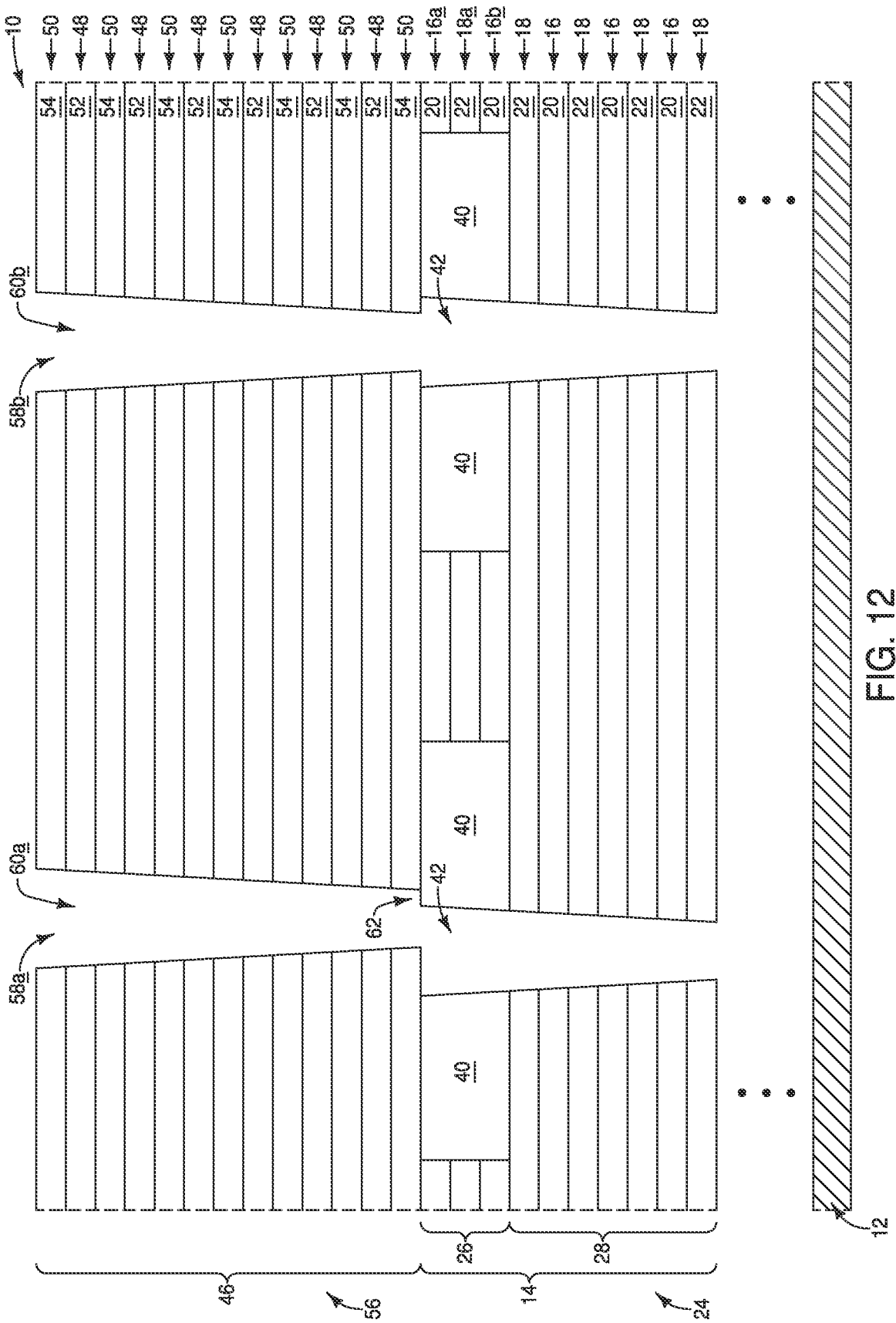

Referring to FIG. 12, the sacrificial material 44 (FIG. 11) is removed. Accordingly, the second openings 58 may be considered to be extended through the sacrificial material 44. In some embodiments, the removal of the sacrificial material may be considered to reopen the first openings 42. In some embodiments, the second openings 58, together with the reopened first openings 42, may be considered to form pillar openings 60 which extend through the first and second stacks 14 and 56. The pillar opening comprising the misaligned opening 58a is labeled as 60a and the other pillar opening is labeled as 60b. The pillar openings 60a and 60b have different shapes relative to one another.

The material 40 forms a step 62 within the pillar opening 60a in the illustrated embodiment of FIG. 12.

Figure 13:
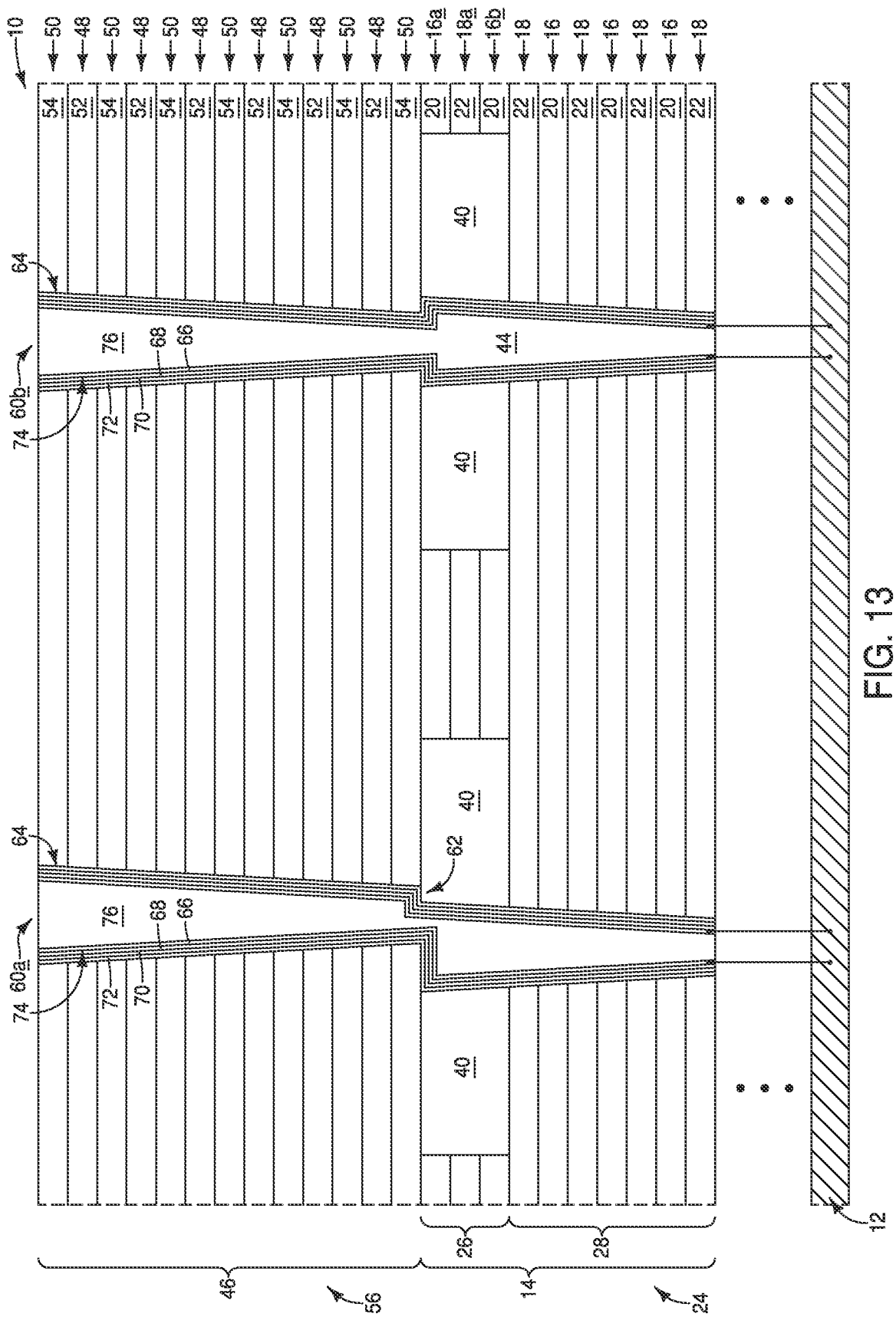

Referring to FIG. 13, cell-material-pillars 64 are formed within the pillar openings 60. The cell-material-pillars include channel material 66, gate-dielectric material (insulative material, tunneling material) 68, charge-storage material 70 and charge-blocking material 72. The channel material 66 may be considered to be configured as channel-material-pillars 74. The channel-material-pillars 74 are electrically coupled with the conductive structure 12, and in some embodiments may directly contact the conductive structure 12. The materials 66, 68, 70 and 72 may have any suitable thicknesses. The materials 66, 68, 70 and 72 are shown to be about the same thicknesses as one another in the diagrammatic illustration of FIG. 13, but generally two or more of the materials would have different thicknesses relative to one another. The channel-material-pillars 74 are shown to be hollow, and to laterally surround an insulative material 76.

The channel material 66 may comprise any suitable semiconductor composition(s). In some embodiments, the channel material 66 may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the channel material 66 may comprise silicon. The silicon may be in any suitable crystalline state (e.g., monocrystalline, polycrystalline, amorphous, etc.).

The gate-dielectric material (tunneling material) 68 may comprise any suitable composition(s); and in some embodiments may comprise one or more of silicon dioxide, silicon nitride, aluminum oxide, hafnium oxide, zirconium oxide, etc. In some embodiments, the material 68 may comprise a bandgap-engineered laminate.

The charge-storage material 70 may comprise any suitable composition(s), and in some embodiments may comprise charge-trapping material (e.g., one or more of silicon nitride, silicon oxynitride, conductive nanodots, etc.).

The charge-blocking material 72 comprise any suitable composition(s), and in some embodiments may comprise one or both of silicon dioxide and silicon oxynitride.

The insulative material 76 may comprise any suitable composition(s), and in some embodiments may comprise, consist essentially of, or consist of silicon dioxide. In some embodiments the insulative material 76 may be omitted and the channel-material-pillars 74 may be solid pillars, rather than being the illustrated hollow pillars.

In some embodiments, the cell materials 68, 70 and 72 are formed within the openings 60 to line the openings, and then the channel material 66 is formed within the lined openings.

The cell material 72 (i.e., the charge-blocking material) directly contacts the buffer material 40 in the shown embodiment. Also, a region of the cell-material-pillar 64 formed within the opening 60a is over the step 62, and is directly against such step in the illustrated embodiment of FIG. 13.

Figure 14:
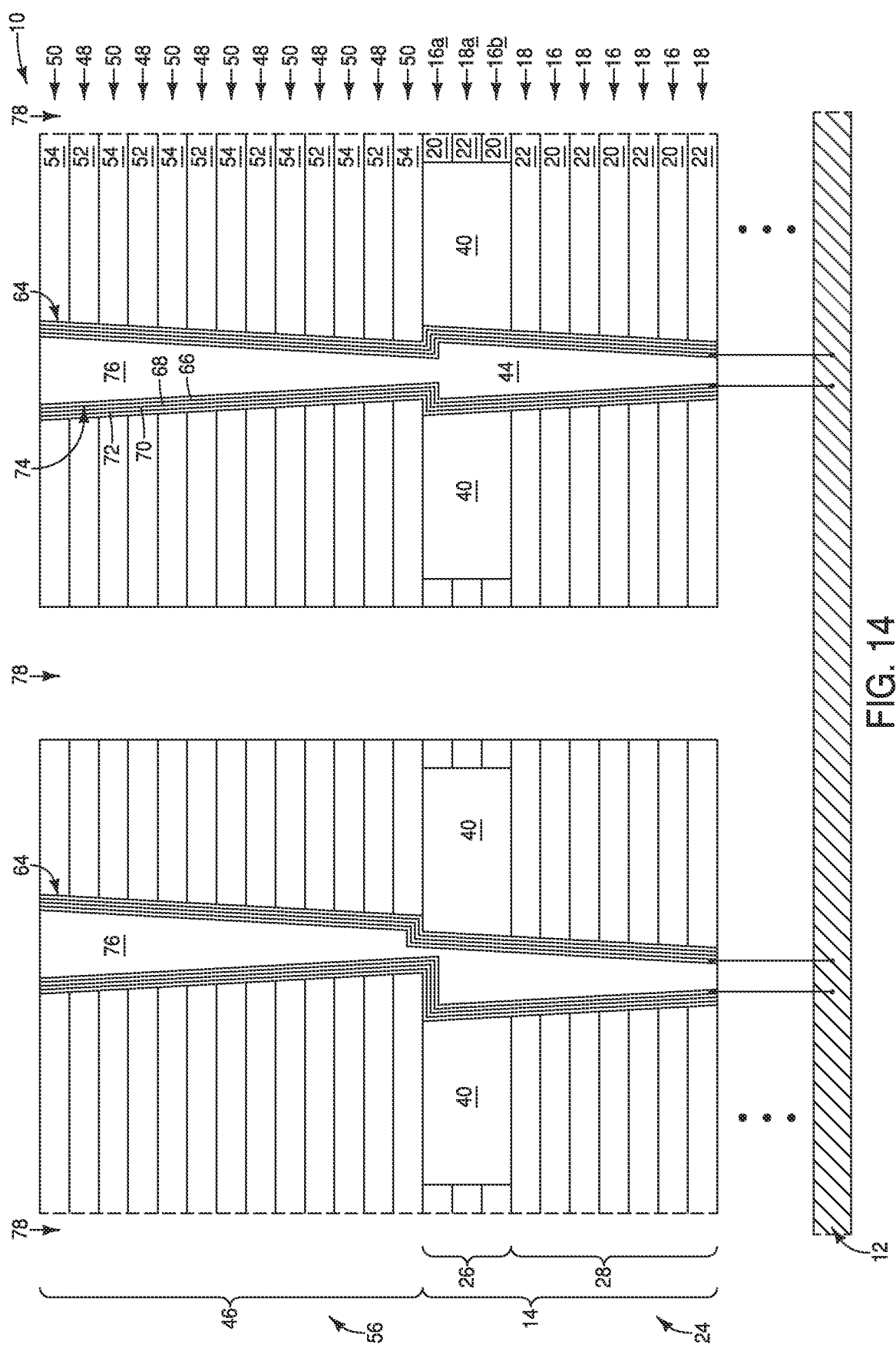

Referring to FIG. 14, slits 78 are formed within the slit locations 32 (FIGS. 7 and 7A).

Figure 15:
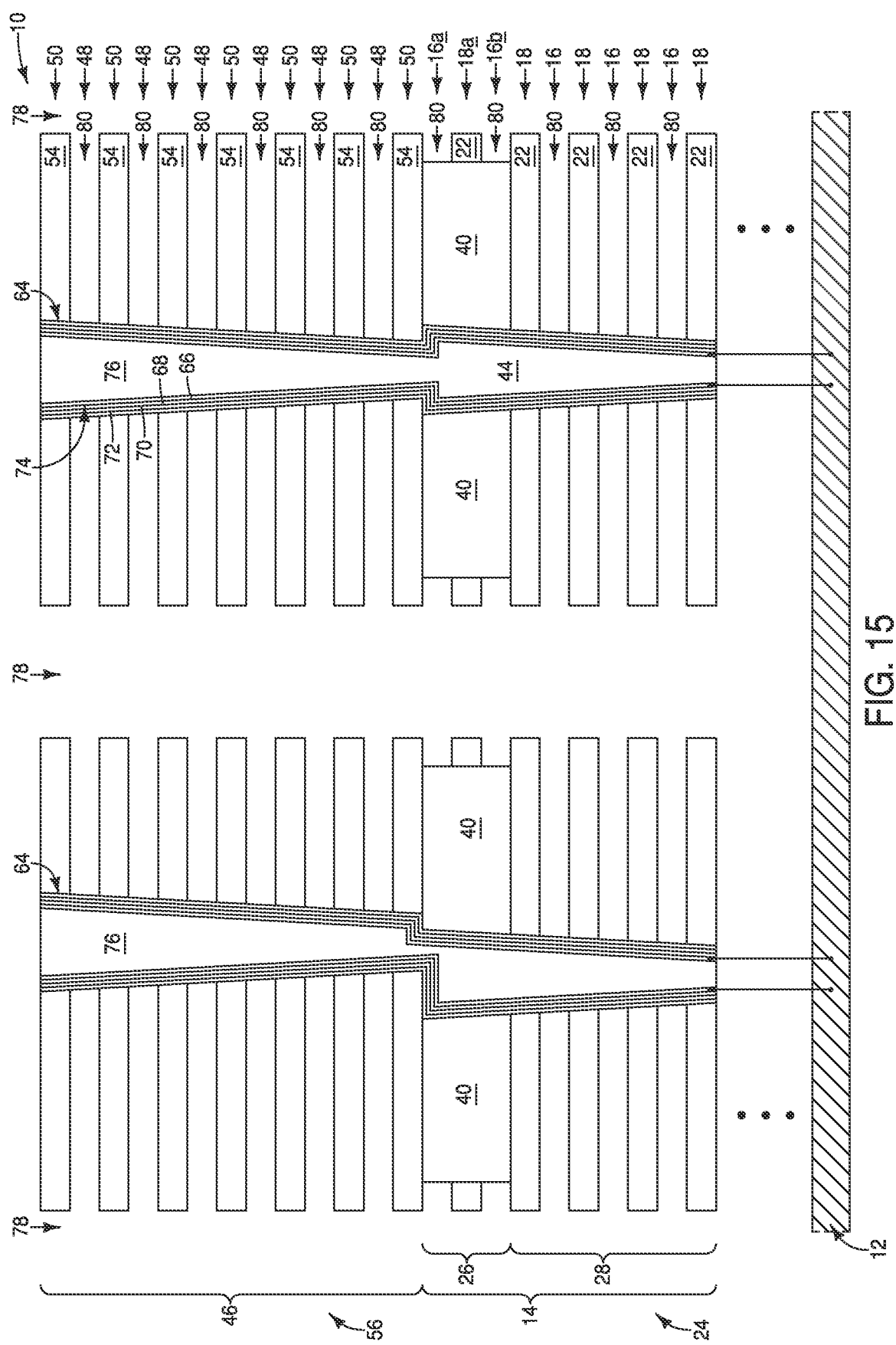

Referring to FIG. 15, the first and third materials 20 and 52 (FIG. 14) are removed to form voids 80 along the tiers (levels) 16 and 48. The first and third materials 20 and 52 may be removed with one or more etchants flowed into the slits 78. In some embodiments, the first and third materials 20 and 52 comprise of silicon nitride and are removed utilizing phosphoric acid.

Figure 16:
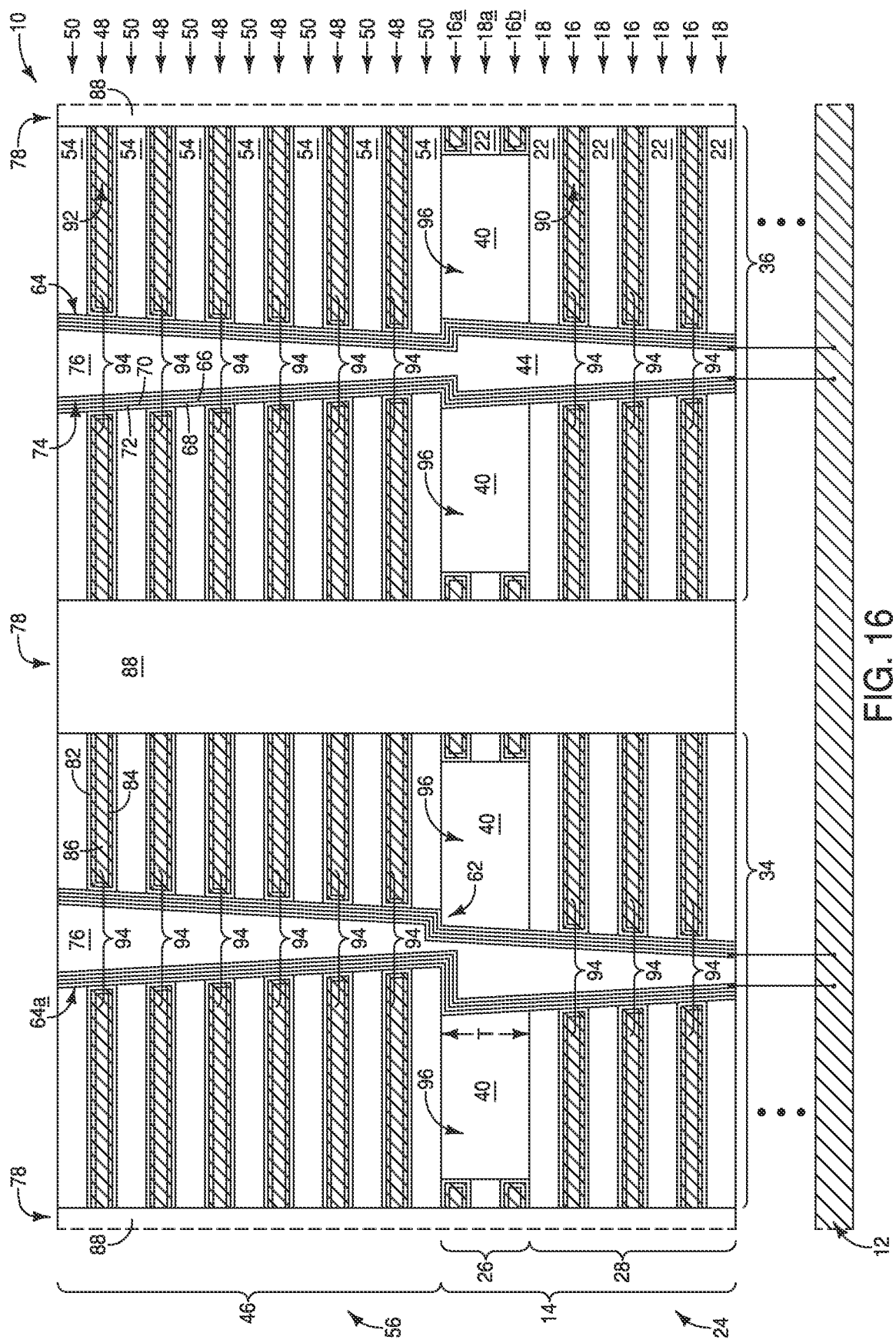

Referring to FIG. 16, the voids 80 (FIG. 15) are lined with dielectric-barrier material 82. The dielectric-barrier material 82 may comprise any suitable composition(s); and may, for example, comprise one or more high-k compositions (e.g., aluminum oxide, hafnium oxide, zirconium oxide, etc.). The term "high-k composition" means a composition having a dielectric constant greater than the dielectric constant associated with silicon dioxide (i.e., greater than about 3.9).

Conductive materials 84 and 86 are formed within the lined voids. The conductive materials 84 and 86 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 86 may comprise a metal-containing core (e.g., a tungsten-containing core), and the conductive material 84 may comprise a metal nitride (e.g., titanium nitride, tungsten nitride, etc.) along a periphery of the metal-containing core.

The processing of FIGS. 14-16 may be considered to replace at least some of the first and third materials 20 and 52 (FIG. 14) with one or more conductive materials (e.g., the conductive materials 84 and 86) to form the conductive levels 16 and 48 of FIG. 16.

Insulative material 88 is formed within the slits 78. The insulative material 88 may comprise any suitable composition(s), and in some embodiments may comprise, consist essentially of, or consist of silicon dioxide. Although the slits 78 are shown to be filled with a single homogeneous material, in other embodiments the slits may be filled with laminates of two or more different materials. For instance, in some embodiments the slits may be filled with suitable materials to form three panels within each of the slits. The three panels may include a central conductive panel (e.g., a panel comprising conductively-doped silicon) sandwiched between a pair of insulative outer panels (e.g., panels comprising silicon dioxide).

The lower deck (first deck) 24 comprises a stack 14 of alternating conductive levels 16 and insulative levels 18, and the upper deck (second deck) 56 comprises a stack 46 of alternating conductive levels 48 and insulative levels 50. The conductive levels 16 of the first deck 24 may be referred to as first conductive levels (or first memory cell levels), and the conductive levels 48 of the second deck 56 may be referred to as second conductive levels (second memory cell levels).

The first memory cell levels 16 may be considered to comprise first conductive regions 90 comprising the conductive materials 84 and 86, and the second memory cell levels 48 may be considered to comprise second conductive regions 92 comprising the conductive materials 84 and 86. The first and second conductive regions 90 and 92 may be identical to one another.

The cell-material-pillars 64 pass through the first and second decks 24 and 56. Memory cells 94 are along the memory cell levels 16 and 48, and comprise regions of the cell-material pillars 64. The memory cells 94 may be considered to be examples of NAND memory cells. The illustrated NAND memory cells 94 are arranged as vertically-extending strings of memory cells.

In some embodiments, the region 26 may be considered to correspond to an intermediate level between the first and second decks 24 and 56. Such intermediate level includes a buffer region 96 comprising the buffer material 40. The buffer region 96 is adjacent to the cell-material-pillars 64. In some embodiments, the material 40 of the buffer region comprises a composition which is different from the compositions of the insulative materials 22 and 54, and which is different from the compositions of the conductive materials 84 and 86.

The buffer region 96 has a vertical thickness T which is equivalent to combined vertical thicknesses of the levels 16a, 16b and 18a. In other words, the buffer region 96 has a vertical thickness which is equivalent to combined vertical thicknesses of two of the memory cell levels (specifically, the memory cell levels 16a and 16b) and one of the insulative levels (specifically, the insulative level 18a). In other embodiments, the buffer region 96 may have a different vertical thickness than that illustrated in FIG. 16.

In the illustrated embodiment of FIG. 16, one of the cell-material-pillars is labeled as 64a. Such cell-material-pillar has a portion over the step 62. The step 62 may be considered to be a segment of the buffer region 96. Accordingly, the portion of the cell-material-pillar over the step 62 may be considered to be along and directly against an upper surface of the buffer region 96.

FIG. 16A shows a top-down view of the upper level 50 of FIG. 16, and shows the cell-material-pillars 64 arranged in tightly-pack configurations within the memory blocks 34 and 36.

The integrated assembly 10 of FIGS. 16 and 16A may be considered to correspond to a portion of a memory device (e.g., a NAND memory device).

The processing stage of FIG. 13 shows the channel-material-pillars 74 formed within the first and second openings 42 and 58 (FIG. 12) in a single step. In other embodiments, portions of the channel-material-pillars may be formed within the lower openings 42 prior to forming the upper stack 46, and then additional portions of the channel-material-pillars may be formed within the upper stack 46 and joined to the lower portions of the channel-material-pillars. An example of such embodiments is described with reference to FIGS. 17-20.

Figure 17:
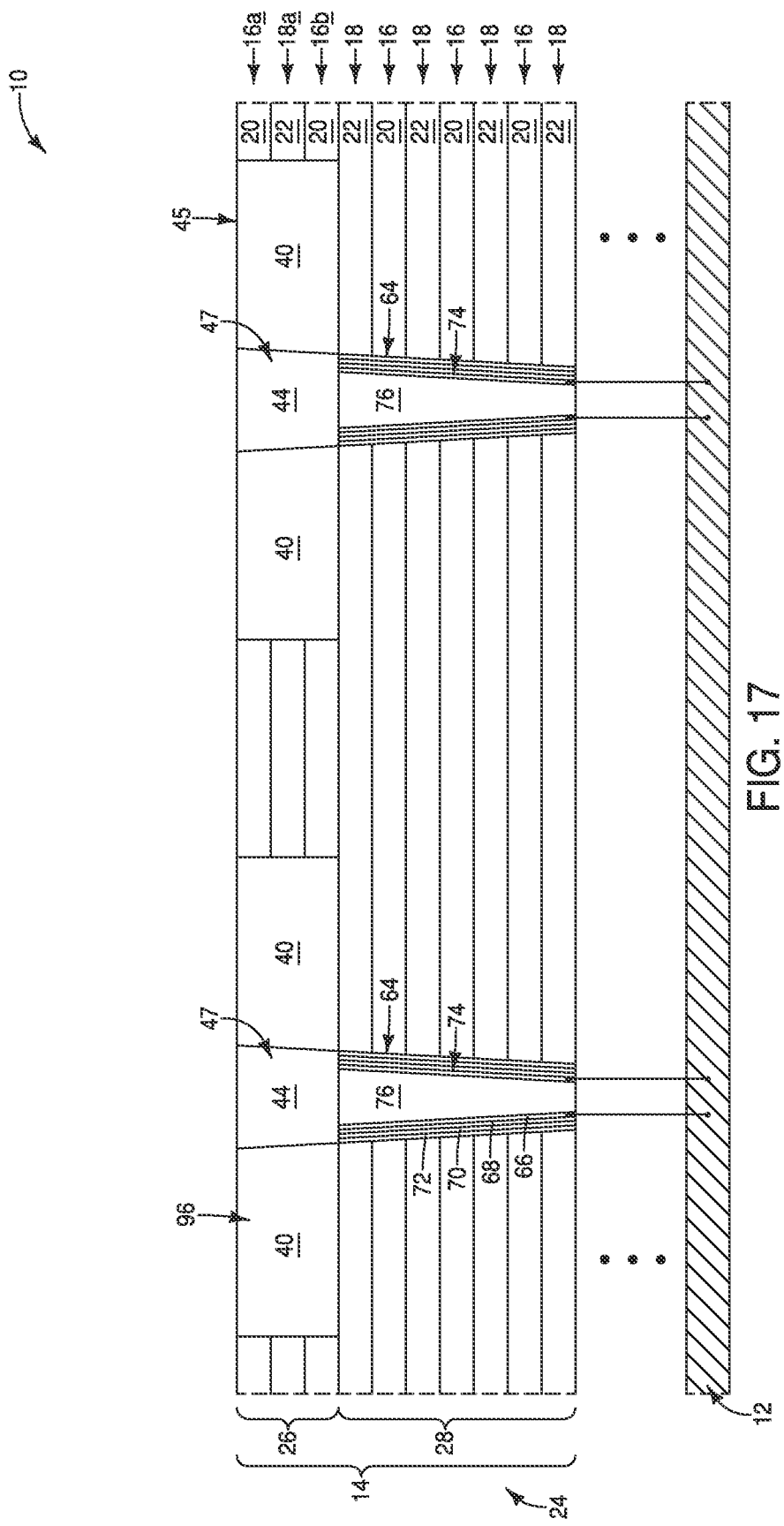
FIGS. 17-20 are diagrammatic cross-sectional side views of the example integrated assembly of FIG. 5 at example sequential process stages following that of FIG. 8.

Referring to FIG. 17, the integrated assembly 10 is shown at a processing stage which may follow that of FIG. 8. Lower portions of the cell-material-pillars 64 are formed within the openings 42 (FIG. 8), and then the sacrificial material 44 is formed over such lower portions of the cell-material-pillars 64. The sacrificial material 44 is configured as plugs 47 extending into the buffer regions 96. A planarized surface 45 is formed to extend across an upper surface of the assembly 10.

Figure 18:
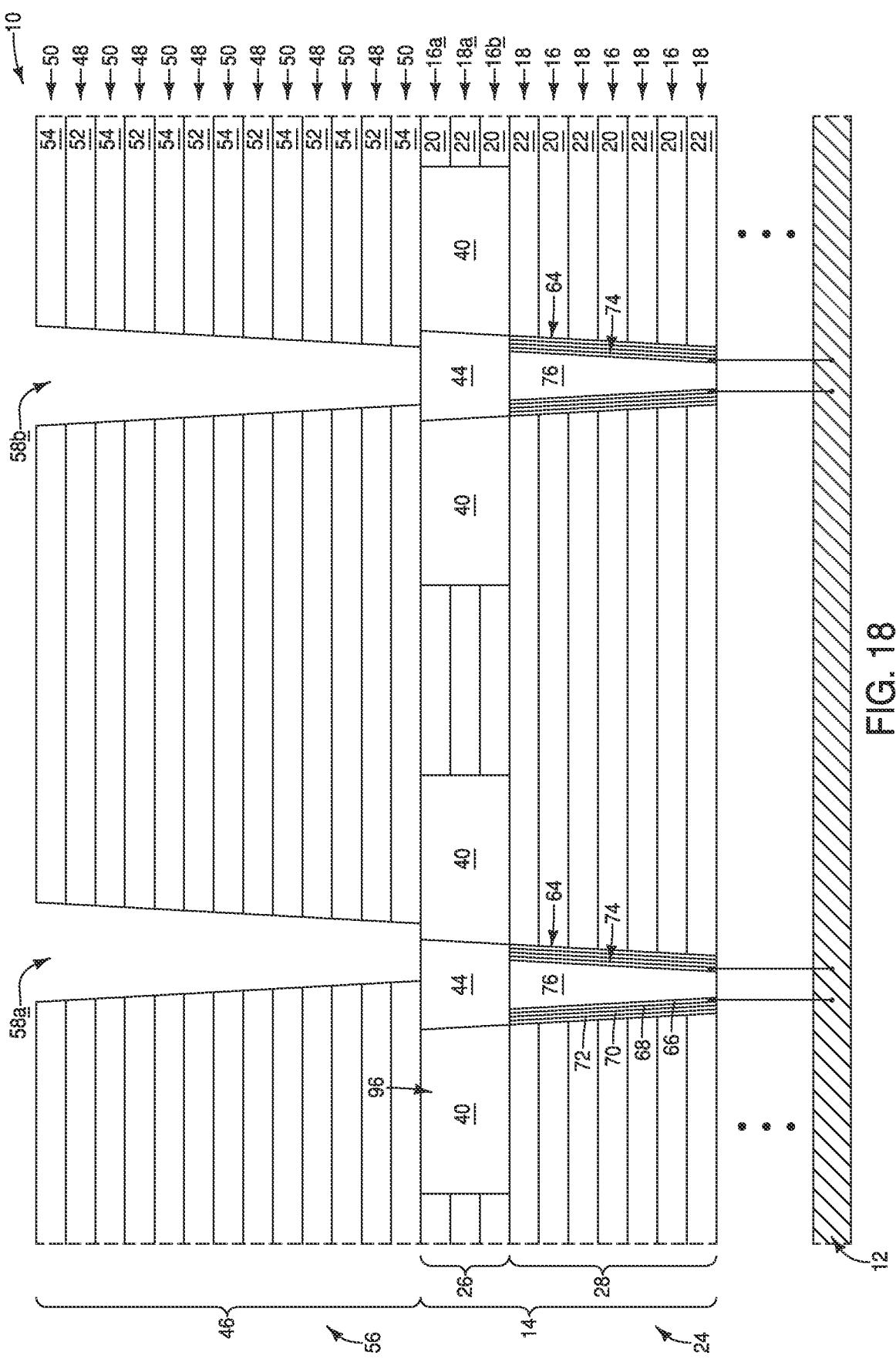

Referring to FIG. 18, the second stack 46 is formed over the first stack 14. The openings 58a and 58b are then formed to extend through the second stack to the sacrificial material 44 with processing analogous to that described above with reference to FIG. 11.

Figure 19:
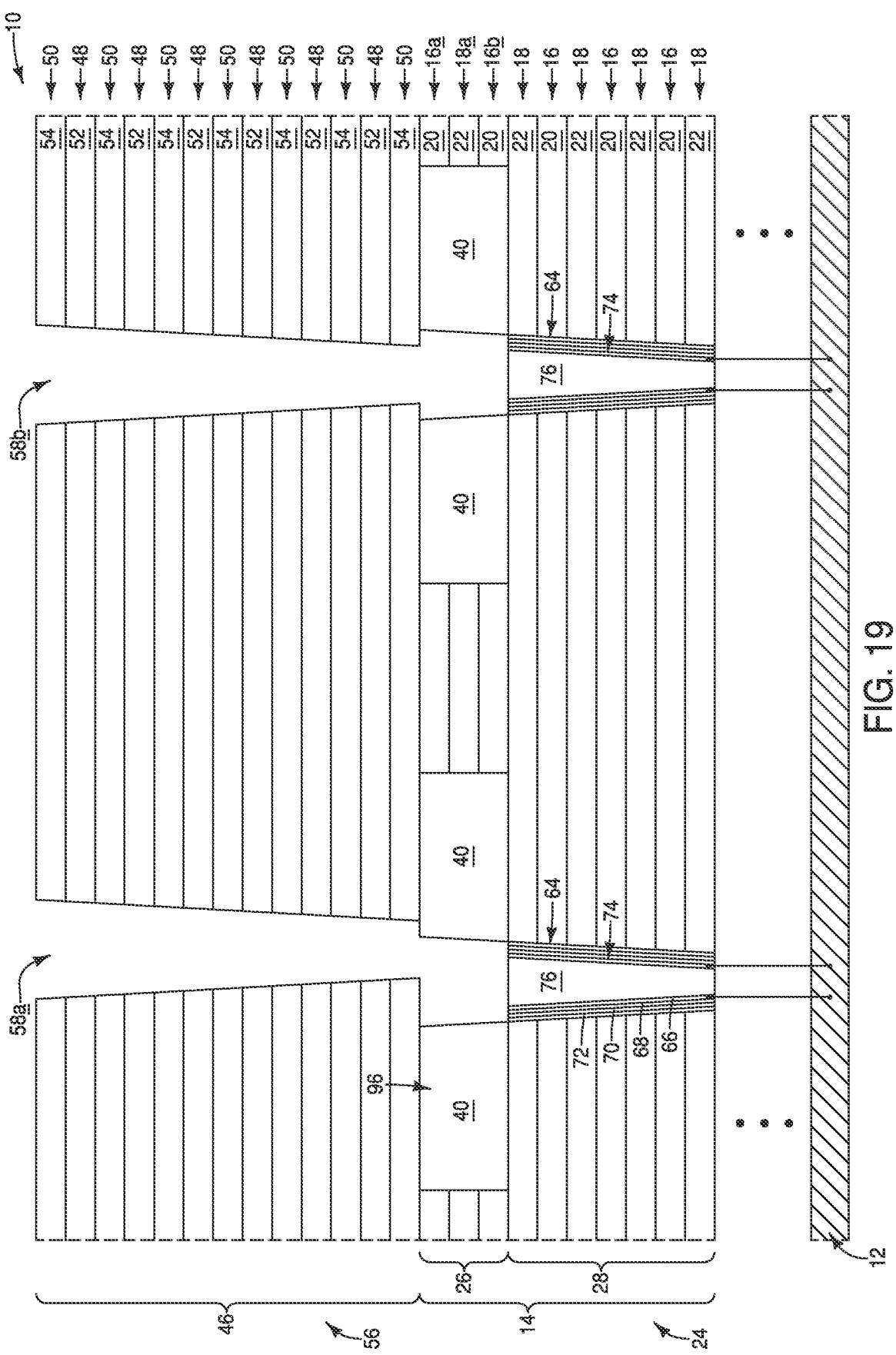

Referring to FIG. 19, the sacrificial material 44 (FIG. 18) is removed to extend the openings 58 to upper surfaces of the cell-material-pillars 64.

Figure 20:
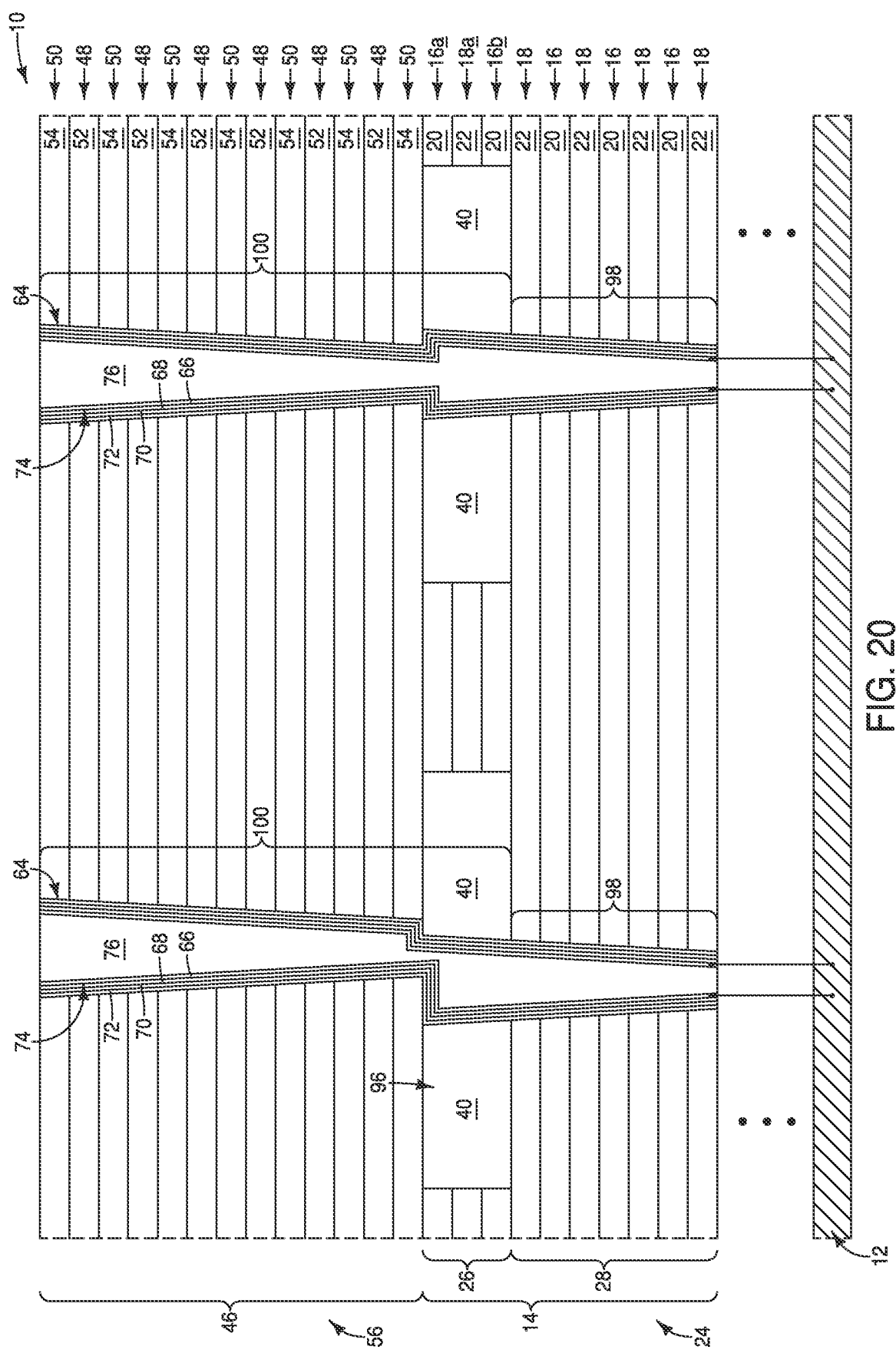

Referring to FIG. 20, upper portions of the cell-material-pillars 64 are formed within the openings 58 (FIG. 19). The upper portions of the cell-material-pillars 64 join with the lower portions that have been formed at the processing stage of FIG. 17. Each of the cell-material-pillars of FIG. 20 may be considered to comprise a lower portion (region) 98 formed at the processing stage of FIG. 17, and an upper portion (region) 100 formed at the processing stage of FIG. 20. The assembly 10 of FIG. 20 may be subjected to further processing analogous to that described above with reference to FIGS. 14-16 to form memory cells (e.g., the memory cells 94 of FIG. 16) along the levels 16.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first deck. The first deck has first memory cell levels alternating with first insulative levels. The first memory cell levels include first conductive regions. The first insulative levels include first insulative material. A second deck is over the first deck. The second deck has second memory cell levels alternating with second insulative levels. The second memory cell levels include second conductive regions. The second insulative levels include second insulative material. A cell-material-pillar passes through the first and second decks. Memory cells are along the first and second memory cell levels and include regions of the cell-material-pillar. An intermediate level is between the first and second decks. The intermediate level includes a buffer region adjacent the cell-material-pillar. The buffer region includes a composition different from the first and second insulative materials, and different from the first and second conductive regions. The buffer region has a vertical thickness which is approximately equivalent to at least a combined vertical thickness of two of the first memory cell levels and one of the first insulative levels.

Some embodiments include a method of forming an integrated assembly. A first stack of alternating first and second tiers is formed. The first and second tiers comprise a first material and an insulative second material, respectively. One of the first tiers is an uppermost first tier. One of the first tiers is below the uppermost first tier and is a penultimate first tier. One of the second tiers is an uppermost second tier, and is between the penultimate first tier and the uppermost first tier. A lower portion of the first stack is under the penultimate first tier. A trench is formed to extend through the uppermost first tier, the uppermost second tier and the penultimate first tier. Buffer material is formed within the trench. A first opening is formed to extend through the buffer material and through the lower portion of the first stack. Sacrificial material is formed within the first opening. A second stack of alternating third and fourth tiers is formed over the first stack, the buffer material and the sacrificial material. The third and fourth tiers comprise a third material and an insulative fourth material, respectively. A second opening is formed to extend through the second stack to the sacrificial material. The second opening is extended through the sacrificial material. A channel-material-pillar is formed within the first and second openings. At least some of the first and third materials is replaced with one or more conductive materials.

Some embodiments include a method of forming an integrated assembly. A first stack of alternating first and second tiers is formed. The first and second tiers comprise a first material and an insulative second material, respectively. A portion of the first stack is within a memory-block-location. A trench is formed to extend through the one or more of the first tiers and to have a bottom along one of the second tiers. A lower portion of the first stack is under the trench. The trench extends substantially entirely across the memory-block-location. Buffer material is formed within the trench. First openings are formed to extend through the buffer material and through the lower portion of the first stack. Sacrificial material is formed within the first openings. A second stack of alternating third and fourth tiers is formed over the first stack, the buffer material and the sacrificial material. The third and fourth tiers comprise a third material and an insulative fourth material, respectively. Second openings are formed to extend through the second stack to the sacrificial material. The second openings are extended through the sacrificial material. The extended second openings merge with the first openings to form pillar openings which extend through the first and second stacks. Cell-material-pillars are formed within the pillar openings. Slits are formed along edges of the memory-block-location. The first and third materials are removed with one or more etchants flowed into the slits. The removal of the first and third materials forms voids within the first and third tiers. One or more conductive materials are formed within the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first deck having first memory cell levels alternating with first insulative levels;
   a second deck over the first deck, the second deck having second memory cell levels alternating with second insulative levels; and
   an intermediate level between the first and second decks, the intermediate level comprising a buffer region, the buffer region having a vertical thickness which is approximately equivalent to at least a combined vertical thickness of two of the first memory cell levels and one of the first insulative levels, and the buffer region comprising a composition of conductive material.

2. The integrated assembly of claim 1 wherein the buffer region comprises a composition different from the first and second insulative levels.

3. The integrated assembly of claim 1 wherein the buffer region comprises a composition different from the first and second memory cell levels.

4. A method of forming an integrated assembly, comprising:
   forming a first stack of alternating first and second tiers, the first and second tiers comprising a first material and an insulative second material, respectively;
   forming a trench to extend through an uppermost portion of the first stack;
   forming buffer material within the trench;
   forming a first opening to extend through the first stack;
   after forming the first opening, forming a second stack of alternating third and fourth tiers over the first stack, the third and fourth tiers comprising a third material and an insulative fourth material, respectively;
   forming a second opening to extend through the second stack to the first opening; and
   forming a channel-material-pillar within the first and second openings.

5. The method of claim 4 further comprising replacing at least some of the first and third materials with one or more conductive materials.

6. The method of claim 4 wherein the forming of the channel-material-pillar comprises forming channel material within both of the first and second openings in a single step.

7. The method of claim 4 further comprising:
   forming a first region of the channel-material-pillar within the first opening;
   forming sacrificial material over the first region of the channel-material-pillar; and
   forming a second region of the channel-material-pillar within the second opening.

8. The method of claim 4 wherein the first and third materials are a same composition as one another.

9. The method of claim 4 wherein the second and fourth materials are a same composition as one another.

10. A method of forming an integrated assembly, comprising:
    forming a first stack of alternating first and second tiers, the first and second tiers comprising a first material and an insulative second material, respectively, a portion of the first stack being within a memory-block-location;
    forming first openings to extend through the first stack;
    forming a trench to extend through an uppermost portion of the first stack;
    forming buffer material within the trench;
    forming a second stack of alternating third and fourth tiers over the first stack and the buffer material, the third and fourth tiers comprising a third material and an insulative fourth material, respectively;
    after forming the first openings, forming second openings through the second stack to the first openings to form pillar openings which extend through the first and second stacks; and
    forming slits along edges of the memory-block-location.

11. The method of claim 10 further comprising removing the first and third materials with one or more etchants flowed into the slits.

12. The method of claim 11 wherein the removal of the first and third materials comprises forming voids within the first and third tiers.

13. The method of claim 12 further comprising forming one or more conductive materials within the voids.

14. The method of claim 10 further comprising forming cell-material-pillars within the pillar openings.

15. The method of claim 14 wherein the cell-material-pillars include charge-blocking material, charge-storage material, tunneling material and channel material.

16. An integrated assembly, comprising:
- a first deck having first memory cell levels alternating with first insulative levels;
- a second deck over the first deck, the second deck having second memory cell levels alternating with second insulative levels; and
- an intermediate level between the first and second decks, the intermediate level comprising a buffer region, the buffer region having a vertical thickness which is approximately equivalent to at least a combined vertical thickness of two of the first memory cell levels and one of the first insulative levels, and the buffer region comprises a composition of semiconductive material.

17. An integrated assembly, comprising:
- a first deck having first memory cell levels alternating with first insulative levels;
- a second deck over the first deck, the second deck having second memory cell levels alternating with second insulative levels; and
- an intermediate level between the first and second decks, the intermediate level comprising a buffer region, the buffer region having a vertical thickness which is approximately equivalent to at least a combined vertical thickness of two of the first memory cell levels and one of the first insulative levels, and the buffer region comprises a composition of metal.

* * * * *